(12) United States Patent
Miklosovic et al.

(10) Patent No.: US 9,634,600 B2
(45) Date of Patent: Apr. 25, 2017

(54) DRIVE PERFORMANCE MEASUREMENT

(71) Applicant: Rockwell Automation Technologies, Inc., Mayfield Heights, OH (US)

(72) Inventors: Robert Miklosovic, Strongsville, OH (US); Brian Fast, Kirtland, OH (US); Aderiano da Silva, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 455 days.

(21) Appl. No.: 14/335,589

(22) Filed: Jul. 18, 2014

(65) Prior Publication Data
US 2016/0018466 A1    Jan. 21, 2016

(51) Int. Cl.
| | |
|---|---|
| *G06F 11/00* | (2006.01) |
| *H02P 23/14* | (2006.01) |
| *H02P 1/00* | (2006.01) |
| *H02P 21/30* | (2016.01) |
| *H02P 23/30* | (2016.01) |
| *G01R 19/00* | (2006.01) |
| *G01R 29/16* | (2006.01) |
| *G01R 31/34* | (2006.01) |

(52) U.S. Cl.
CPC .......... *H02P 23/14* (2013.01); *G01R 19/0092* (2013.01); *G01R 29/16* (2013.01); *G01R 31/343* (2013.01); *H02P 1/00* (2013.01); *H02P 21/30* (2016.02); *H02P 23/30* (2016.02)

(58) Field of Classification Search
CPC .. G01R 31/34; G01R 31/343; G01R 19/0092; G01R 19/0053; G01R 29/16; G06F 1/00; G06F 2101/00; G06F 2201/00; H02P 1/00; H02P 21/30; H02P 23/30; H02P 21/22
USPC ......................................... 702/127, 182–185
See application file for complete search history.

(56) References Cited

U.S. PATENT DOCUMENTS

| | | | | |
|---|---|---|---|---|
| 8,129,936 | B2 * | 3/2012 | Becker | H02P 21/30 318/767 |
| 9,274,149 | B2 * | 3/2016 | Alimi | G01R 19/0053 |
| 9,360,515 | B2 * | 6/2016 | Hirono | H02M 1/32 |

* cited by examiner

*Primary Examiner* — An Do
(74) *Attorney, Agent, or Firm* — Amin, Turocy & Watson, LLP

(57) ABSTRACT

A motor drive is provided with integrated frequency response analysis tools for generating drive performance metrics that are independent of motion profile and tuning. The metrics are broadly applicable to a wide range of applications, tunings, and load types, and can be used to fairly compare performance across different drives models and assist in drive selection. The frequency analysis tools include a transformation algorithm that reduces or eliminates spectral leakages, a signal generation component that scales the test input signal as a function of frequency avoid saturation based on defined limits of the controlled system, and a phase unwrapping algorithm that correctly unwraps the phase of open-loop and closed-loop response curves. The frequency response analysis tools yield an open-loop response, a closed-loop response, a tracking error response, and a disturbance rejection response, which are used to derive performance metrics for the drive.

20 Claims, 28 Drawing Sheets

DRIVE PERFORMANCE MEASUREMENT

BACKGROUND

The subject matter disclosed herein relates generally to industrial automation, and, more particularly, to techniques for generating performance metrics for motor drives and their associated motor/load systems.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a motor drive is provided comprising an interface component configured to receive one or more configuration parameters, wherein the input parameters comprise at least a start frequency for a frequency analysis, a stop frequency for the frequency analysis, a number of frequency bins to be generated by the frequency analysis, and a type of spacing to be used to space the frequency bins; a signal generator component configured to generate an input signal that controls a mechanical system during a frequency response test sequence; and a performance metrics component configured to generate performance metric data for the motor drive based on the input signal and an output signal measured from the mechanical system representing a response of the mechanical system to the input signal, wherein the performance metrics component is further configured to transform at least one of the input signal or the output signal from a time-domain signal to a frequency-domain signal based on the one or more input parameters, the frequency-domain signal comprises the number of frequency bins defined by the one or more input parameters, and the frequency bins are spaced between the start frequency and the stop frequency according to the type of spacing define by the one or more input parameters.

In one or more other embodiments, a method for deriving performance metrics for a motor drive is described, comprising receiving, by a motor drive comprising at least one processor, input parameters comprising at least a start frequency for a frequency analysis, a stop frequency for the frequency analysis, a number of frequency bins to be generated by the frequency analysis, and a type of spacing to be used to space the frequency bins; generating, by the motor drive, an input signal that controls a mechanical system during execution of a frequency response test; measuring an output signal from the mechanical system representing a response of the mechanical system to the input signal; and deriving performance metric data for the motor drive based on the input signal and the output signal, wherein the deriving comprises at least transforming at least one of the input signal or the output signal from a time-domain signal to a frequency-domain signal based on the input parameters, the frequency-domain signal comprises the number of frequency bins defined by the input parameters, and the frequency bins are spaced between the start frequency and the stop frequency according to the type of spacing define by the input parameters.

In one or more other embodiments, a non-transitory computer-readable medium is provided having stored thereon instructions that, in response to execution, cause a motor drive to perform operations, the operations receiving frequency test parameters comprising at least a start frequency for a frequency analysis, a stop frequency for the frequency analysis, a number of frequency bins to be generated by the frequency analysis, and a type of spacing to be used to space the frequency bins; generating an input signal configured to actuate a mechanical system during a frequency response test; measuring a response of the mechanical system to the input signal to yield an output signal; and generating performance metric data for the motor drive based on the input signal and the output signal, wherein the generating comprises at least transforming at least one of the input signal or the output signal from a time-domain signal to a frequency-domain comprising the number of frequency bins defined by the frequency test parameters, and spacing the frequency bins between the start frequency and the stop frequency according to the type of spacing defined by the frequency test parameters.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
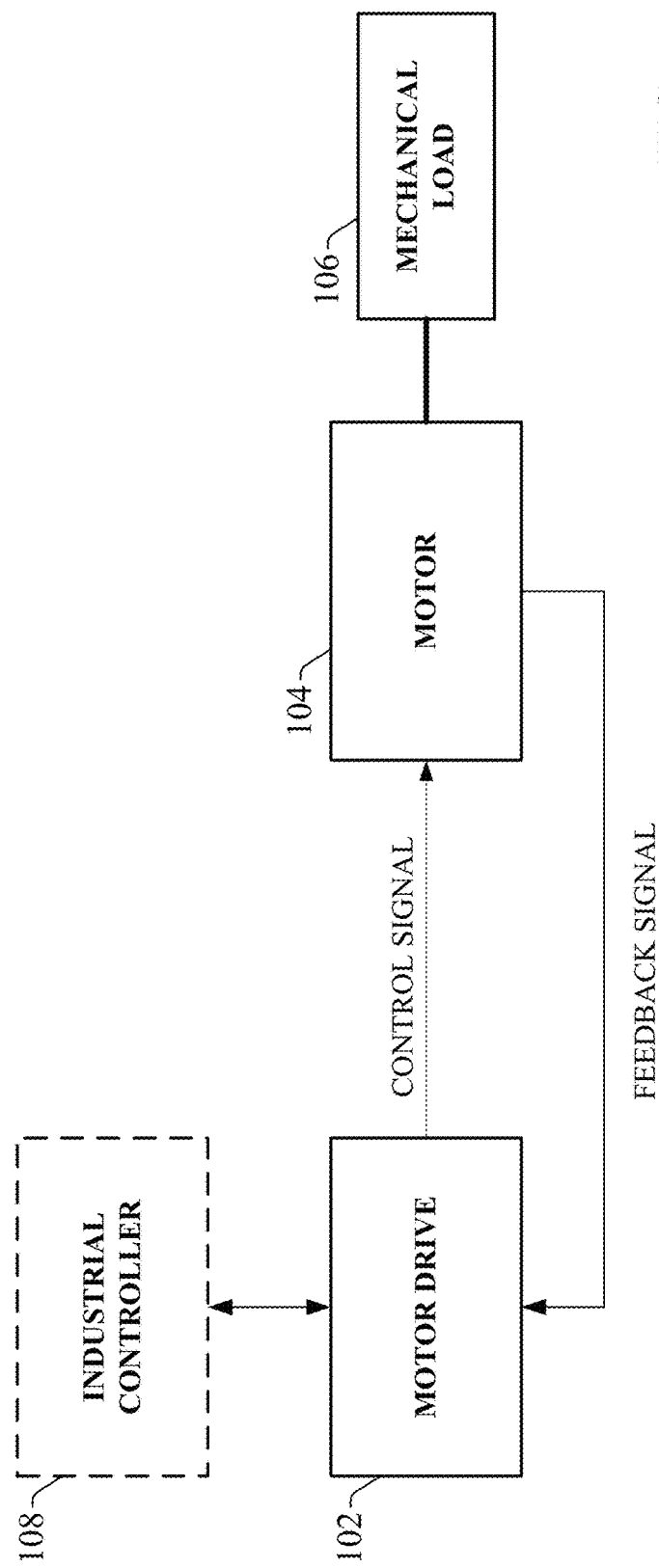
FIG. 1 is a block diagram of a simplified closed-loop motor control system.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Motion control systems are integral to many industrial automation applications. These systems generally comprise an electric motor or servo connected to a mechanical load, and a motor drive that controls the motor to facilitate moving or actuating the mechanical load according to a predefined control routine. The motor drive may be a stand-alone drive that controls the motor according to a control routine stored locally on the drive, or alternatively may operate under supervision of a control program executed by a separate industrial controller (e.g., a programmable logic controller or the like), which communicates with the motor drive over a plant network or via discrete hardwired I/O.

When designing a motion control system or upgrading an existing system, system designers endeavor to select a motor drive having operational and performance specifications that best suit the mechanical load to be controlled. Selection of a suitable motor drive can depend on such factors as the horsepower of the motor, mechanical characteristics of the mechanical load driven by the motor, speed and/or precision of movement required by the industrial application, and other such factors. In general, a key criterion in selecting a suitable motor drive for a new or existing industrial application is the drive performance in terms of how precisely the drive can move a given mechanical load.

However, it is often difficult to identify the best drive for a given customer application since motor drives are not typically classified by performance. This is due in part to the fact that there are no standards or metrics to characterize drive performance, which depends in part on customer-specific or application-specific factors such as the drive's parameters, control loop tuning, the motor being controlled, the mechanical characteristics of the load being driven by the motor, etc. Consequently, the drive selection process generally considers the drive's specifications, features, and cost, but does not account for performance. On the drive manufacturer side, the drive development process also fails to account for performance; instead, market research is conducted to determine the desired product specifications, and the drive is designed to ensure that the specification is met.

Moreover, there are currently no tools or guidelines that provide a fair drive performance comparison across different motor drive types, models, or families Although some initial insight regarding performance differences among various motor drive platforms can be obtained based on system designers' experience, technical drive specifications, and experimental tests, these approaches to predicting and comparing drive performance levels becomes less reliable as the differences in drive specifications from different drive platform become less distinct.

Some insight into drive performance can also be obtained from control loop update time, modeling analysis, or proof of concepts. However, control loop update time represents only one of many factors that dictate drive performance. Since modeling analysis requires a case-by-case analysis of the particular system to be controlled, such analysis does not enable easy drive performance comparison between different drive platforms.

As a new generation of motor drives is being developed to replace older drives, system designers must be assured that the performance of the new drives will meet or exceed the performance of the older drives. Since there are no tools or metrics to identify and quantify drive performance, the existing design process does not guarantee an increase in performance from the older drives to the new generation of motor drives.

Conventional frequency response methods can generally be used to identify performance of a motion system. However, such approaches, which are based on textbook formulas and assumptions, often fail to obtain accurate frequency response results in industrial applications due to high computation time, lack of guidelines for dealing with resonance frequencies, computation errors (e.g., spectral leakage) due to the dependency on the number of data samples and linear spacing between measured frequencies, and characterization errors caused by small signal analysis or saturation.

Dyne testing is sometimes used to characterize a drive performance. However, this time-domain test provides performance data for a single operating condition in terms of motion profile, tuning gains, frame size, motor, and load. These results are not easily translated to customer scenarios or across different drive platforms. In general, time-domain tests are dependent on motion profile, tuning, and load. Consequently, such tests capture the system performance for a particular operating condition and do not provide enough information about the system to generalize the results for deriving the system performance at other operating conditions.

Control loop update time may also be indicative of drive performance. However, control loop update time is only one of many factors that affect the drive's performance. Other factors affecting drive performance include, but are not limited to, compliance; backlash; the motor/drive/load combination; position, velocity, and current loop bandwidth; control loop and power converter architecture; filter types and discretization methods; hardware and software limits; tuning; motion profile, coarse update rate, etc. Since the impact of each of these factors on the drive performance is unknown, the use of a single factor such as control loop update time to describe or compare drive performance is unreliable.

Accordingly, one or more embodiments of the present disclosure relate to techniques for generating drive performance metrics based on the frequency response of a drive, motor, and load system. Four performance metrics are derived using the techniques described herein—open-loop response, closed-loop response, tracking error response, and disturbance rejection response. The techniques for deriving these performance metrics yield results that are drive platform independent, and which are applicable over a broad range of industrial applications and operating scenarios. Once obtained, these performance metrics can be applied in a number of ways. For example, the performance metrics can be used to fairly compare drive performance across a variety of motor drives and to classify the drives by performance level. The performance metrics can also be used to tune the drives for high performance, identify system bandwidth, estimate compliance, and measure resonance frequencies.

In some scenarios, the performance metrics can also be used in a simulation environment to predict machine performance. Simulations that leverage the performance metrics can also be used to tune the system and to predict position following error and torque requirements for a given motion profile.

In some embodiments, the computational tools (e.g., frequency response algorithms, signal generators, Bode tools, etc.) for determining the drive performance metrics can be embedded on the drive itself; e.g., as embedded firmware features.

To provide a general context for the systems and methods for deriving drive performance metrics described herein, FIG. 1 illustrates a simplified closed-loop motor control system. Mechanical load 106 represents a motor-driven movable component of an industrial automation system (e.g., a positioning system, a conveyor, a single-axis or multi-axis robot, a pump, a centrifuge, etc.). Motor 104 is mechanically coupled to mechanical load 106 and drives the motion of mechanical load 106 in response to a control signal provided by motor drive 102. Motor drive 102 may be, for example, a variable frequency drive (VFD), a servo drive, or other type of drive. VFDs control the speed, position, and/or torque of alternating current (AC) motors by controlling the frequency and voltage of three-phase power delivered to the motor 104. Servo drives control the speed, position, or torque of servo motors by controlling the duty cycle of pulse outputs to the motor 104.

Motor drive 102 may be a stand-alone drive that controls motor 104 according to a control routine stored locally on the drive. For configurations using stand-alone motor drives, the control signal to the motor 104 is determined based on a position, speed, or torque reference value generated by the local control routine on the motor drive. This reference value represents the desired position, speed, or torque of the mechanical load 106 at a given time. Alternatively, motor drive 102 may be configured to operate under supervision of a control program execute by a separate industrial controller 108 (e.g., a programmable logic controller, a safety controller, or the like), which communicates with motor drive 102 over a plant network or via discrete hardwired I/O. In such configurations, industrial controller 108 runs a control program comprising code used to process input signals read into the controller 108 where the code can comprise, for example, ladder logic, sequential function charts, function block diagrams, or structured text. Industrial controller will then generate instruction outputs (e.g., reference signals indicating a desired position, speed, and/or torque for mechanical load 106) in accordance with the control program.

In closed-loop configurations, the motor drive 102 also reads a feedback signal from the motor indicating a present state (e.g., position, velocity, etc.) of the motor 104 and/or mechanical load 106. The feedback signal may be generated, for example, by a resolver or encoder that tracks an absolute or relative position of the motor 104, or by a speed or position estimator. When the motor drive 102 commands the motor 104 to move the mechanical load 106 to a new position or to transition to a new speed, the motor drive 102 and/or industrial controller 108 monitors the feedback signal to ensure that the mechanical load 106 has accurately transitioned to the desired position or speed. The motor drive 102 or industrial controller 108 compares the actual position/speed of the mechanical load 106 as indicated by the feedback signal with the target position/speed, and adjusts the control signal as needed to reduce or eliminate error between the actual and target positions/speeds. It is to be appreciated that the systems and methods described herein for estimating drive performance metrics are not limited to use with the exemplary types of motion control systems described above, but rather are applicable for substantially any type of drive-based motion control system.

Figure 2:
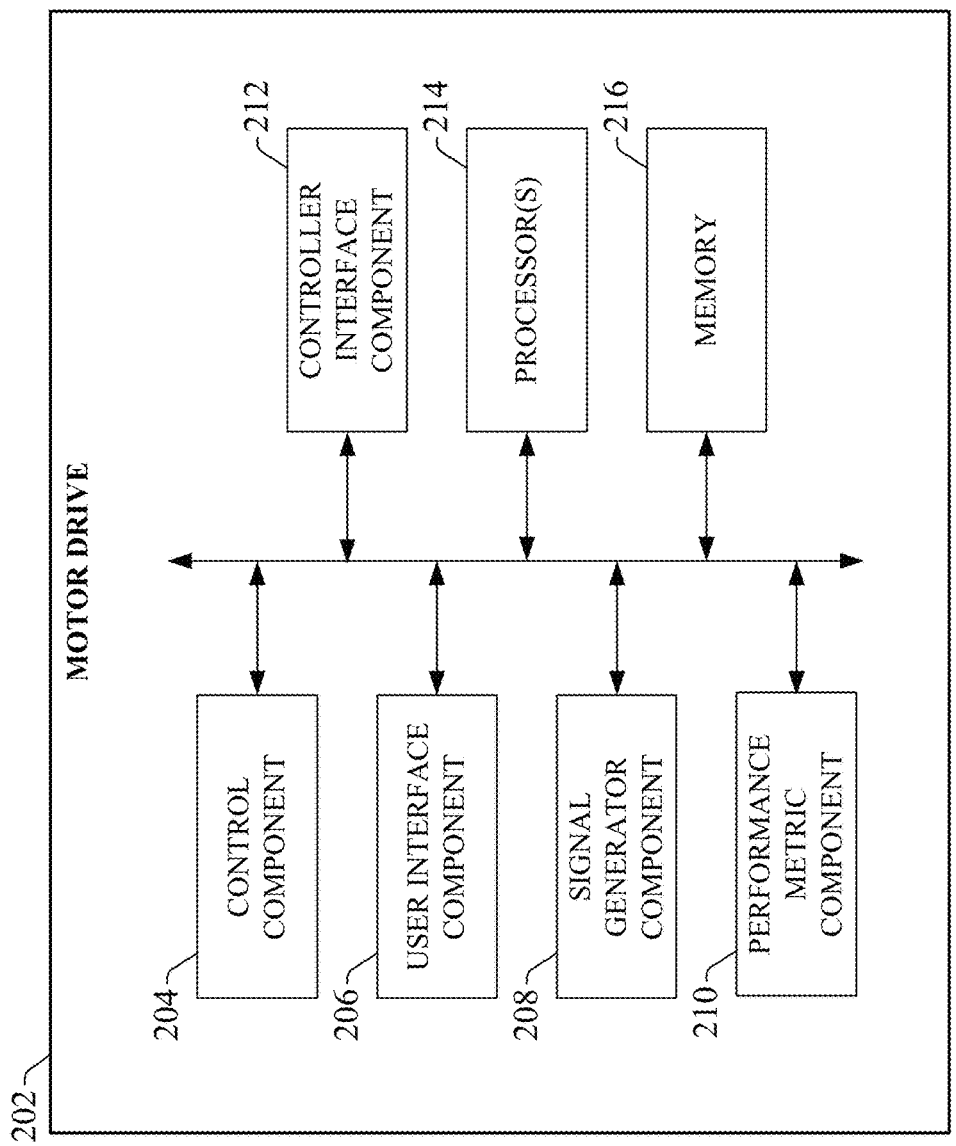
FIG. 2 is a block diagram of an example motor drive.

FIG. 2 is a block diagram of an example motor drive 202 according to one or more embodiments of this disclosure. Although FIG. 2 depicts certain functional components as residing on motor drive 202, it is to be appreciated that one or more of the functional components illustrated in FIG. 2 may reside on a separate device relative to motor drive 202 in some embodiments. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Motor drive 202 can include a control component 204, a user interface component 206, a signal generator component 208, a performance metric component 210, a controller interface component 212, one or more processors 214, and memory 216. In various embodiments, one or more of the control component 204, user interface component 206, signal generator component 208, performance metric component 210, controller interface component 212, the one or more processors 214, and memory 216 can be electrically and/or communicatively coupled to one another to perform one or more of the functions of the motor drive 202. In some embodiments, components 204, 206, 208, 210, and 212 can comprise software instructions stored on memory 216 and executed by processor(s) 214. Motor drive 202 may also interact with other hardware and/or software components not depicted in FIG. 2. For example, processor(s) 214 may interact with one or more external user interface devices, such as a keyboard, a mouse, a display monitor, a touchscreen, or other such interface devices.

Control component 204 can be configured to control the motor drive's outputs (e.g., three-phase voltage outputs, pulse output frequency, or other type of control signaling) to an associated motor based on either a local control configuration (in the case of stand-alone drives) or in response to commands issued by industrial controller communicatively coupled to the motor drive 202. User interface component 206 can be configured to receive user input and to render output to the user in any suitable format (e.g., visual, audio, tactile, etc.). In some embodiments, user interface component 206 can be configured to communicate with a graphical user interface (e.g., a programming or development platform) that executes on a separate hardware device (e.g., a laptop computer, tablet computer, smart phone, etc.) communicatively connected to motor drive 202. In such configurations, user interface component 206 can receive input parameter data entered by the user via the graphical user interface, and deliver output data (e.g., drive performance metric data) to the interface. As will be described in more detail below, input parameter data can include, for example, a selected performance metric of interest, a signal generator frequency range, dynamic test limits, or other such parameters. Output data can comprise, for example, performance metric information, frequency response results, machine signature data, or other such information.

Signal generator component 208 can be configured to generate the input signal to be delivered to the motor/mechanical load during performance metric testing. Signal generator component 208 can generate the input signal in accordance with the input parameters provided by the user, as well as internal signal-generating algorithms that scale the sine wave amplitude as a function of test frequency in order to mitigate noise issues and maintain a signal strength to avoid saturation and small signal analysis, as will be described in more detail below. Performance metric component 210 can be configured to generate a set of frequency responses for the four performance metrics based on the input signal used to control the mechanical system and the corresponding measured output signal. Performance metric component 210 can also calculate associated metrics corresponding to the frequency response results (e.g., zero-crossing bandwidth, gain margins, phase margins, position and velocity errors, etc.).

Controller interface component 212 can be configured to exchange data with an industrial controller, either over a hardwired or a networked connection. For networked connections, controller interface component 212 can be configured to communicate with the controller over substantially any type of network, including but not limited to control and information protocol (CIP) networks (e.g., DeviceNet, ControlNet, Ethernet/IP, etc.), Ethernet, DH/DH+, Remote I/O, Fieldbus, Modbus, Profibus, CAN, wireless networks, serial protocols, or other such networks.

The one or more processors 214 can perform one or more of the functions described herein with reference to the systems and/or methods disclosed. Memory 216 can be a computer-readable storage medium storing computer-executable instructions and/or information for performing the functions described herein with reference to the systems and/or methods disclosed.

Figure 3:
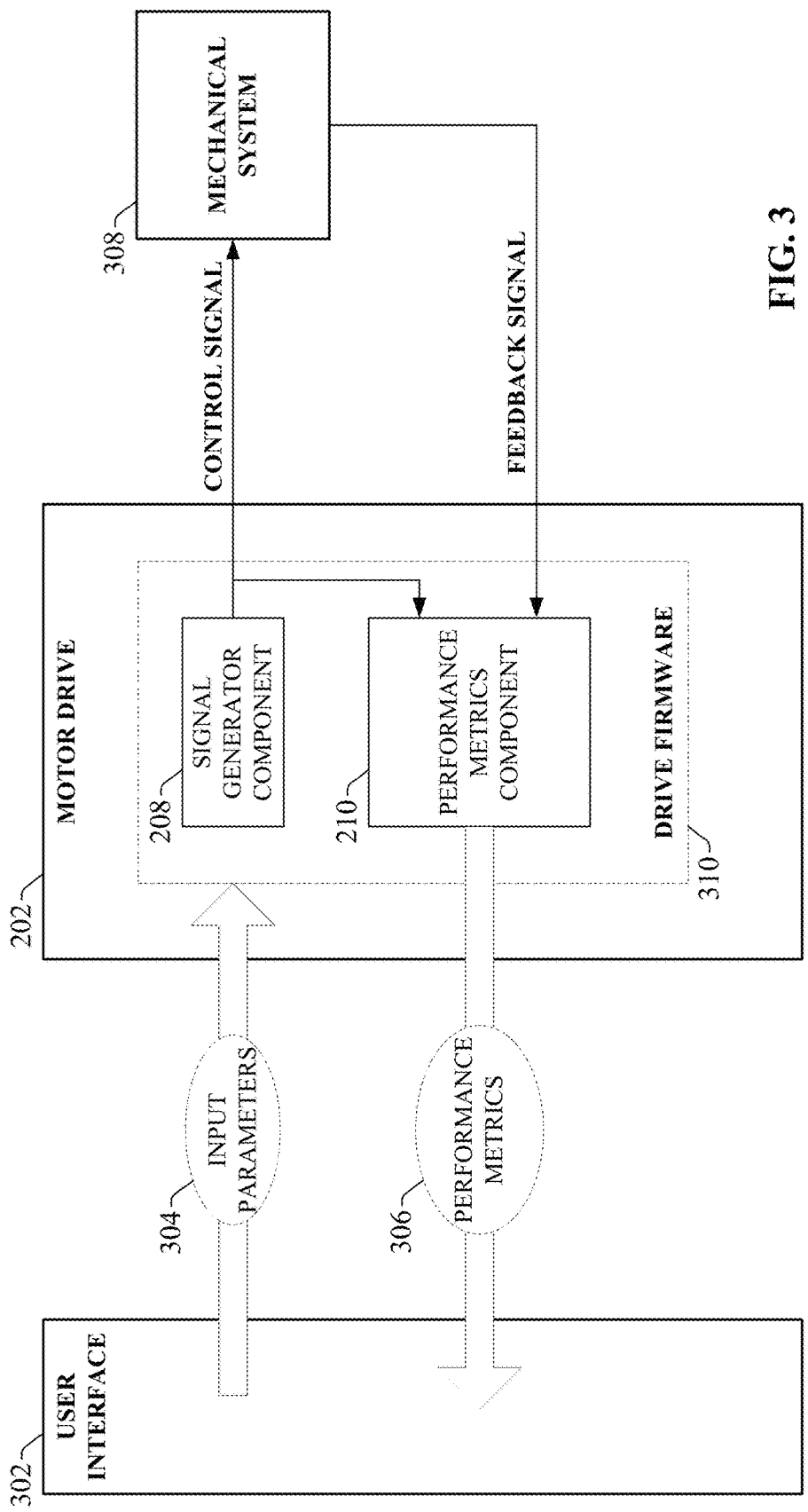
FIG. 3 is a block diagram illustrating a general data flow for determining the frequency response and associated performance metrics for a motor drive using tools and algorithms implemented in the drive's firmware.

FIG. 3 is a block diagram illustrating a general data flow for determining the frequency response and associated performance metrics for a motor drive using tools and algorithms implemented in the drive's firmware. As described above, motor drive 202 can comprise a signal generator component 208 and a performance metric component 210, which may be embedded in the drive as part of the drive's firmware 310. A user may interface with the embedded performance metrics tools via a user interface 302, which may be a programming or development environment that executes on a separate computing device (e.g., a laptop or tablet computer, a smart phone, or other such device) that is communicatively connected to the motor drive (e.g., via user interface component 206 of FIG. 2). In general, the firmware tools will determine the drive performance metrics by running a predefined test sequence on a measured system comprising a mechanical system 308 (e.g., a motor coupled to a mechanical load), as well as the control loops and power converter of the motor drive. According to this sequence, the signal generator component 208 sends a control signal to the measured system 308 in accordance with predefined algorithms associated with the signal generator component 208 (to be described in more detail herein) and input parameters 304 provided by the user via user interface 302. The input parameters 304 can define certain limits of the test sequence, as dictated by the limits and specifications of the measured system 308. Input parameters 304 can include, for example, selection of a particular performance metric to be determined (e.g., open-loop response, closed-loop response, tracking error response, or disturbance rejection response), definition of the signal generator frequency range, and dynamic test limits.

During the test sequence, the signal generator component 208 sends a sine wave input signal to the control loop of measured system based on the input parameters 304 provided by the user, and by drive limitations (e.g., encoder resolution and system inertia). The sine wave input signal can be a position, velocity, or current command signal (for position, velocity, and current loop tests, respectively). The signal generator component 208 produces the sine wave input signal such that the amplitude and frequency of the signal keeps the drive within the limits of the drive and motor.

During the test sequence, performance metric component 210 captures system data over a range of frequencies and builds a metric based on both the input signal generated by signal generator component 208 and the output signal from the measured system, which represents the response of the measured system to the input signal. Performance metric component 210 then delivers the resulting performance metrics 306 to the user interface 302 for viewing and storage, or for importing into other diagnostic or design systems.

Figure 4:
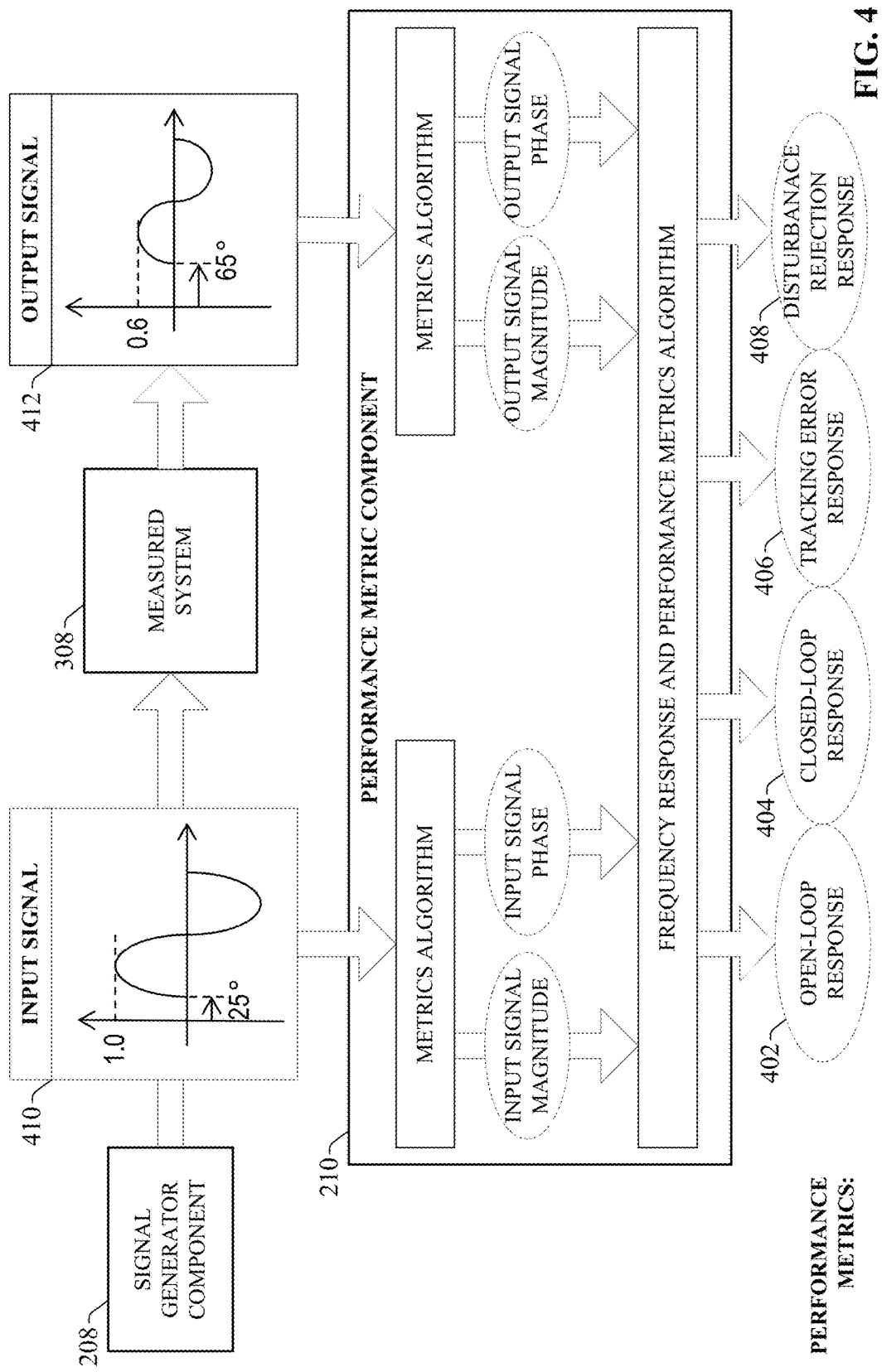
FIG. 4 is a block diagram of an example performance metrics system.

FIG. 4 illustrates a more detailed block diagram of the example performance metrics system. A described above, signal generator component 208 generates an input signal 410 for controlling measured system 308 (motor, mechanical load driven by the motor, control loops, power converter, etc.) during the testing sequence. The amplitude and phase of input signal 410 is based on predefined signal generation algorithms as well as input parameters provided by the user (e.g., a selected performance metric of interest, a signal generator frequency range for the test sequence, dynamic test limits, or other such parameters). During the test, the signal generator component 208 delivers the input signal 410 over a range of frequencies corresponding to the frequency range specified by the user as an input parameter. The response of the measured system 308 is measured by the drive as output signal 412 and provided to the performance metric component 210, together with the input signal 410.

Metrics algorithms that execute as part of the performance metric component 210 determine the magnitudes and phases of the input signal 410 and output signal 412 across the frequency range. Based on these results, additional algorithms determine a set of four frequency responses, which can be used to generate performance metrics for the drive. These frequency responses comprise an open-loop frequency response 402, a closed-loop frequency response 404, a tracking error frequency response 406, and a disturbance rejection frequency response 408. Together, these four performance metrics characterize performance of a drive, motor, and load system with the drive in either velocity or position mode.

Figure 5:
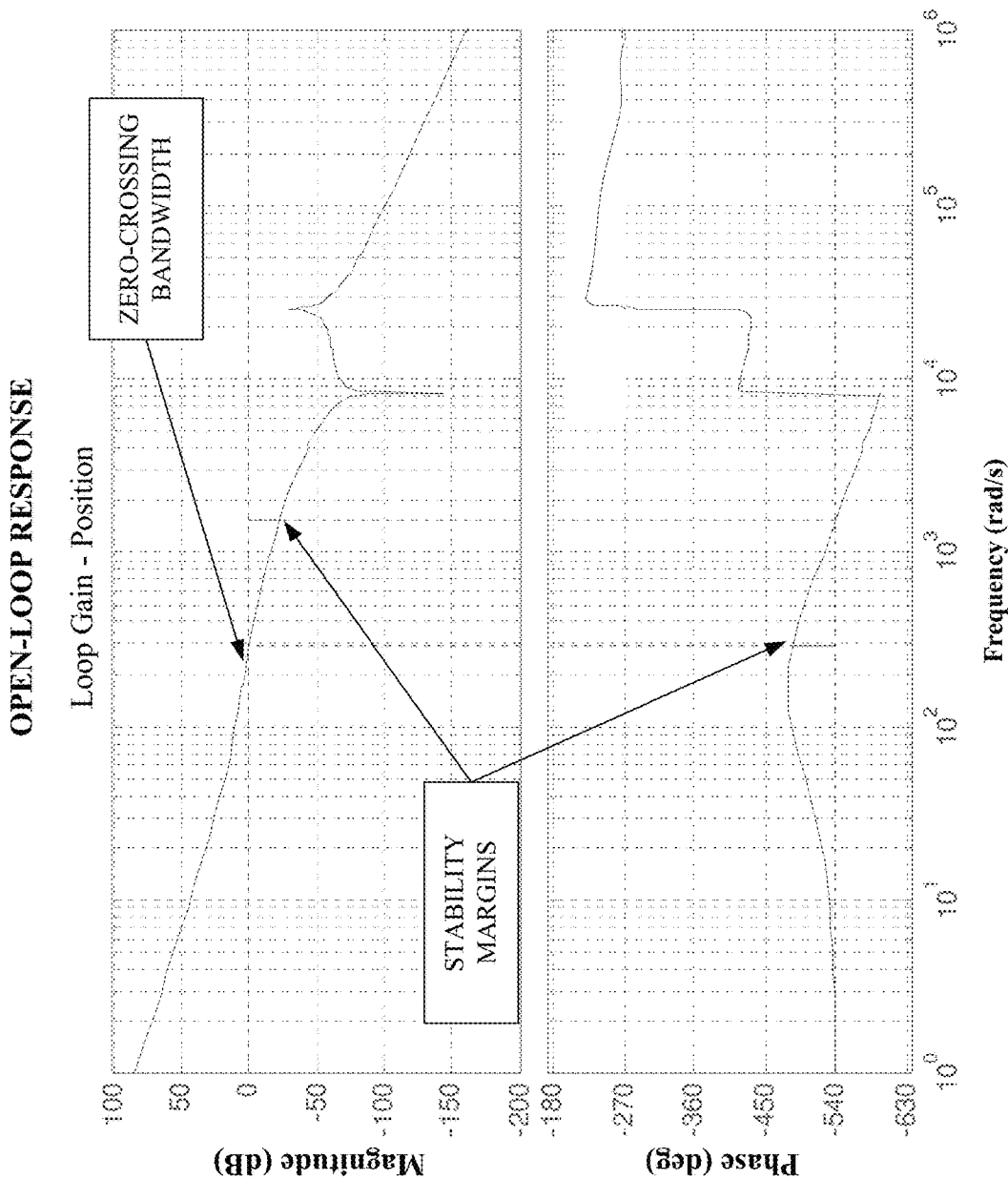
FIG. 5 is a plot of an example open-loop frequency response.

Before discussing the input signal generation techniques and metrics algorithms used to derive these results, the frequency responses and associated drive performance metrics yielded by the performance metric component 210 are discussed in turn. FIG. 5 illustrates a Bode plot of an example open-loop frequency response. The open-loop frequency response can be used to calculate stability gain and phase margins, which are used to guide the user toward an optimal drive tuning, and which can create a fair comparison (in terms of tuning) for the other three metrics and between different drives. The stability margins represent how close the system is to instability, and how aggressively the drive is tuned. The open-loop frequency response can also be used to identify mechanical resonances in the mechanical system being controlled. The open-loop frequency response can also be used to identify the zero-crossing bandwidth (also known as the open-loop bandwidth), which together with the stability margins can be used to determine tuning stiffness. Once the drive is tuned, the closed-loop frequency response, tracking error frequency response, and disturbance rejection can be used to produce performance curves independent of motion profile and network performance.

As noted above, the open-loop frequency response can be used to perform a fair comparison of performance metrics across different drives. This is achieved by tuning the drives that are to be compared such that the drives all produce a specified common stability margin (as identified by the open-loop frequency response) and then deriving the other metrics in order to measure performance of the drives. This drive tuning can be performed, for example, by the drive manufacturer so that their available drives are tuned to this common stability margin, allowing a fair comparison of the performance metrics across all the manufacturer drives.

Figure 6:
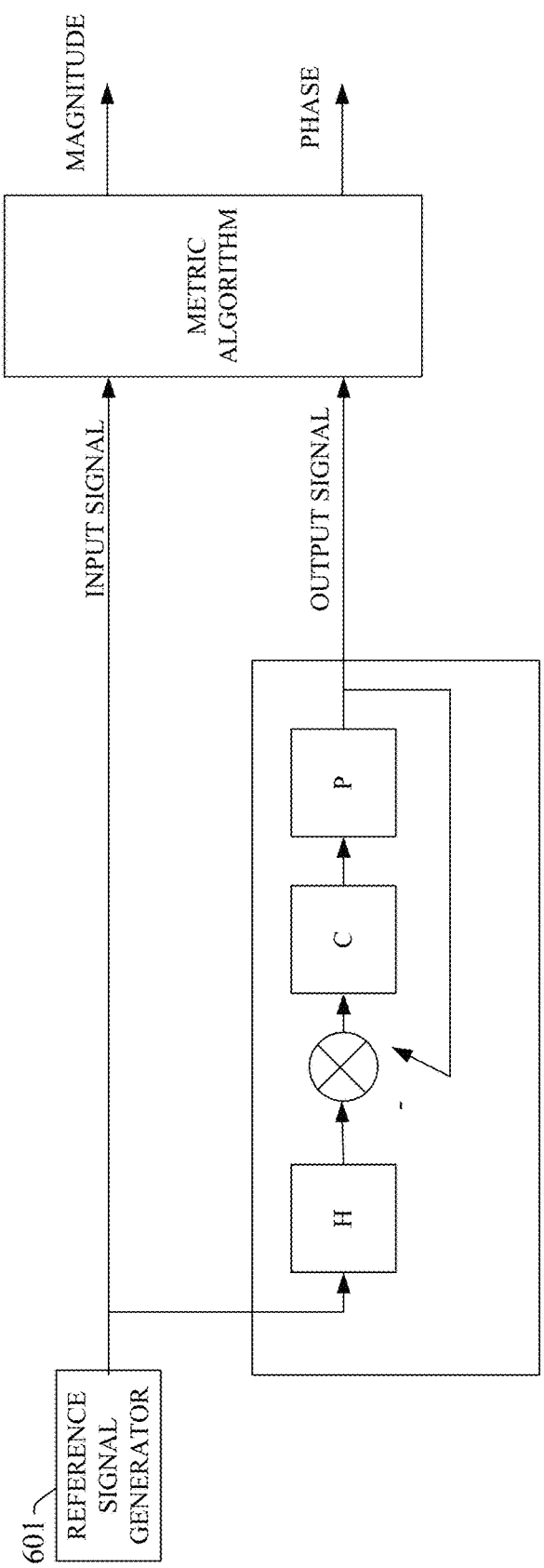
FIG. 6 is a block diagram of a generalized open-loop configuration for generating the Bode plot of an open-loop frequency response.

The open-loop frequency response depicted in FIG. 5 is an example open-loop position curve derived with the drive in position mode—whereby the input signal is a position command—and disconnected from the output signal (position feedback from the measured system) during measurement. The open-loop frequency response can also be derived for velocity or current. FIG. 6 illustrates a block diagram of a generalized open-loop configuration for generating an open-loop frequency response Bode plot. In this figure, H and C are the control loops in the motor drive and P is the plant, consisting of the power converter in the motor drive, the motor electrical and mechanical, and the mechanical load. H, P, and C are part of the measured system, depending on what metric is calculated. As illustrated in FIG. 6, reference signal generator 601 generates an input signal for controlling the position, velocity, torque, or other controlled aspect of plant P (e.g., a motor drive, power converter, a motor and its associated mechanical load). The input signal represents the target value for the controlled aspect, which is provided to the controller C via a pre-filter H, which can be set to 1 to simplify derivation of the open-loop frequency response. To generate the open-loop Bode plot, the reference signal generator 601 formats the input signal (i.e., command signal) as a sinusoidal signal that varies in frequency. The pre-filtered input signal is provided to controller C (e.g., a motor drive or a controller that controls operation of the drive), which controls plant P in accordance with the input signal. The measured output signal, representing the measured position or velocity (or other controlled aspect) of the plant P in response to the input signal, is analyzed together with the original input signal to yield Bode plots for the magnitude and phase of the open-loop frequency response (such as the example Bode plots depicted in FIG. 5). As shown in FIG. 6, the output signal is not fed back to the controller for open-loop analysis, and the controller C does not adjust the control output to the plant for error correction based on measured feedback. In general, the open-loop frequency response characterizes the loop gain L=CP, which expresses the effect of controller C when applied to the plant and is the stack up of gain and phase around the feedback loop. In terms of metrics, the open-loop frequency response measures key qualities of a closed-loop system that otherwise cannot be directly measured with a closed-loop Bode plot.

Figure 7:
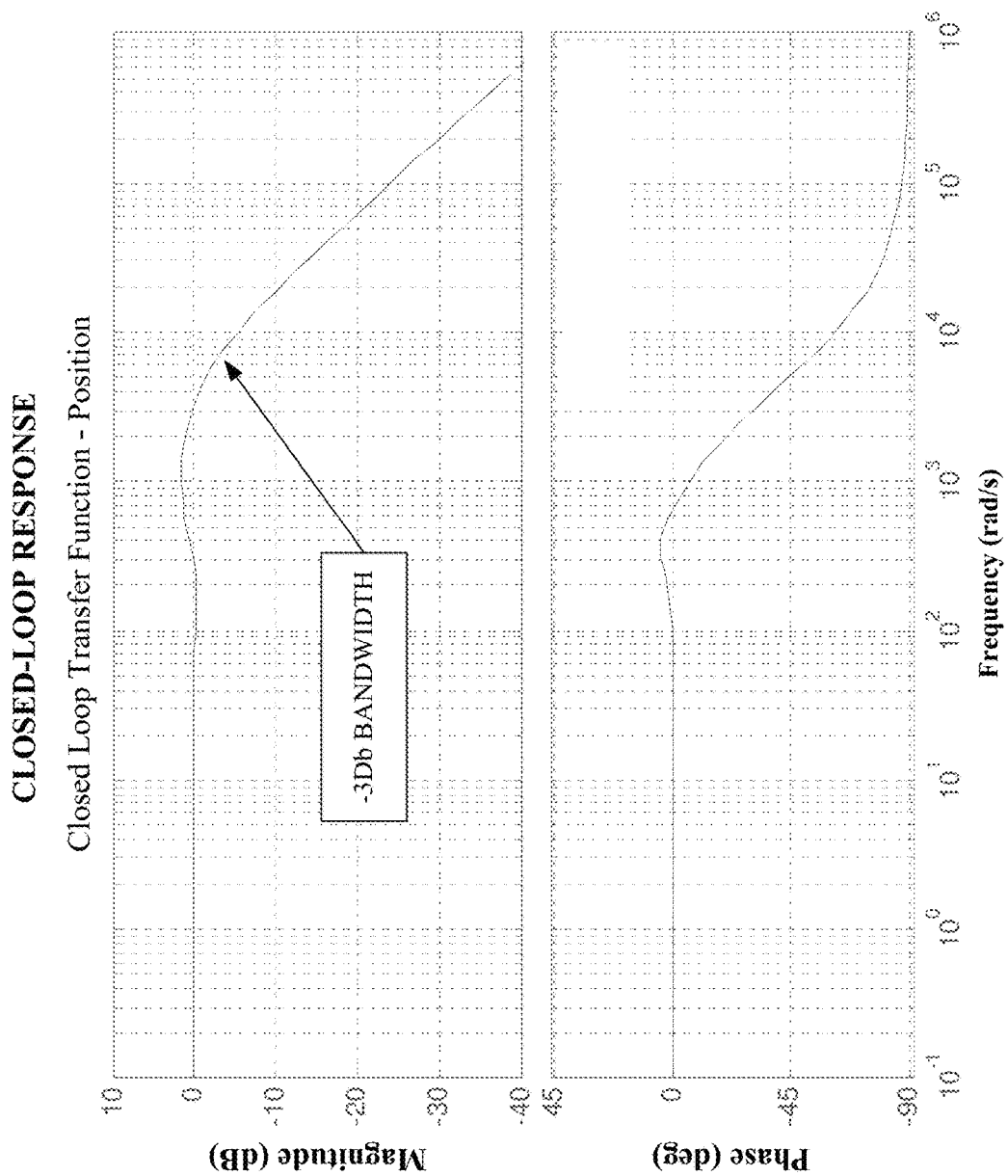
FIG. 7 is a plot an example closed-loop response.

FIG. 7 illustrates an example closed-loop frequency response, which measures the overall bandwidth of the system including the motor, drive, and load. The closed-loop bandwidth is defined as the frequency range at which the magnitude is above 3 dB or below −3 dB. The closed-loop frequency response can also be used to derive signals relevant to drive performance, such as maximum position and velocity errors, for any given motion profile. Consequently, the closed-loop frequency response can be used as an efficient alternative to a high fidelity simulation model. Since the closed-loop frequency response characterizes input-output behavior and represents an overall system performance, this metric can be used to classify drives by performance level, and facilitate fair performance comparison between different drives.

The example closed-loop frequency response depicted in FIG. 7 is an example closed-loop position, generated with the drive in position mode (whereby the input signal is a position command and the output signal is position feedback from the measured system). Closed-loop frequency response can also be identified for velocity or current.

Figure 8:
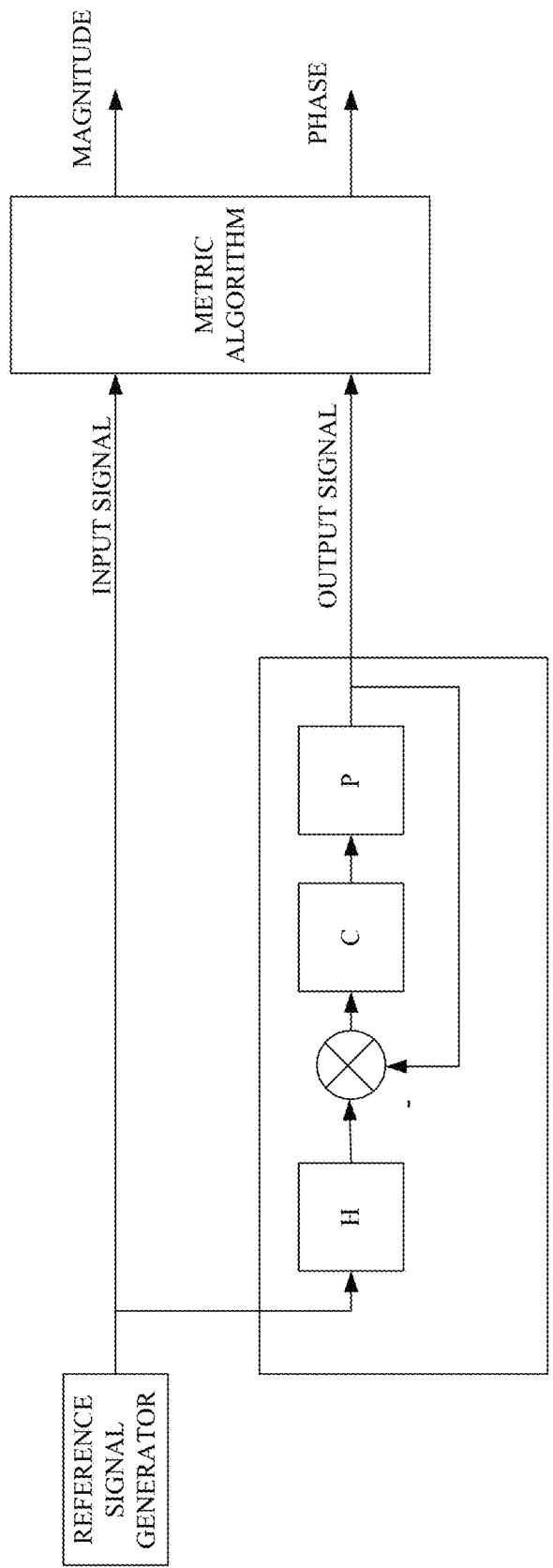
FIG. 8 is a block diagram of a generalized closed-loop configuration for generating a closed-loop response Bode plot.

FIG. 8 illustrates a block diagram of a generalized closed-loop configuration for generating a closed-loop frequency response Bode plot. The closed-loop configuration is similar to the open-loop configuration depicted in FIG. 6, except that the output signal is fed back to the controller to facilitate error correction by the controller C. In general, the closed-loop frequency response Bode plot characterizes the closed-loop transfer function T=HL/(1+L), where L is the open-loop gain (L=CP). This expresses the transfer function between the command (input signal) and the feedback (output signal). In terms of performance metrics, the closed-loop frequency response Bode plot identifies the closed-loop bandwidth and overall phase response.

Figure 9:
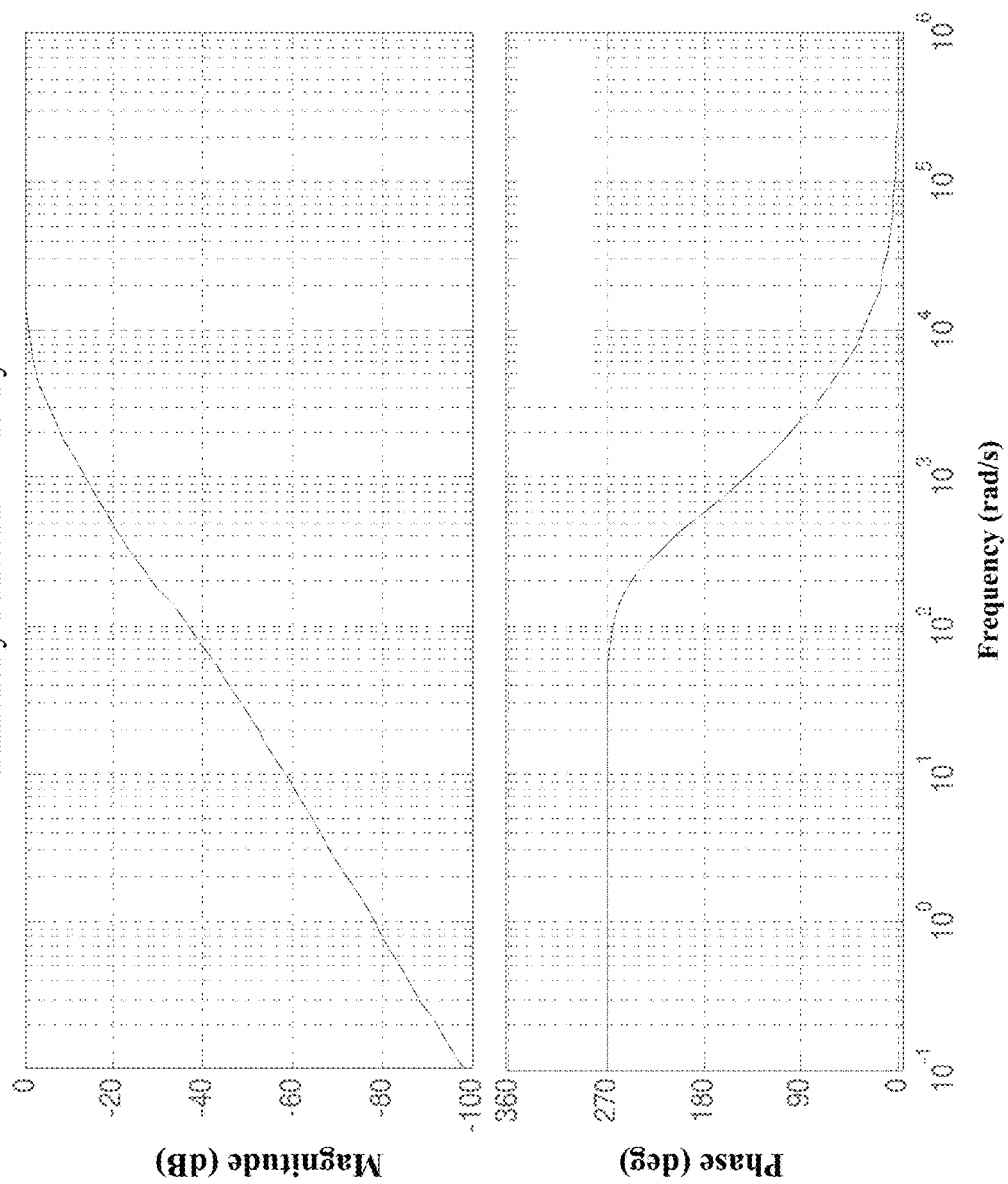
FIG. 9 is a plot of an example tracking error response.

FIG. 9 illustrates an example tracking error frequency response, also referred to as a sensitivity function S, which can be characterized by:

$$S = \frac{1 + L - HL}{1 + L} \tag{1}$$

where L is the open loop gain. The tracking error frequency response represents the transfer function between the command (input signal) and the position or velocity error, and measures position and velocity tracking error as a function of input frequencies, where lower amplitudes in the error signal indicate better performance. Since position and velocity errors are primary design constraints for customers, the tracking error frequency response can provide valuable information about the capability of a drive platform to meet the position and velocity following error requirements specified in the performance requirements for a given industrial application or machine. In certain types of industrial applications (e.g., paper cutting applications), the tracking error frequency response can be an indicator of the amount of production waste that is generated during operation.

Figure 10:
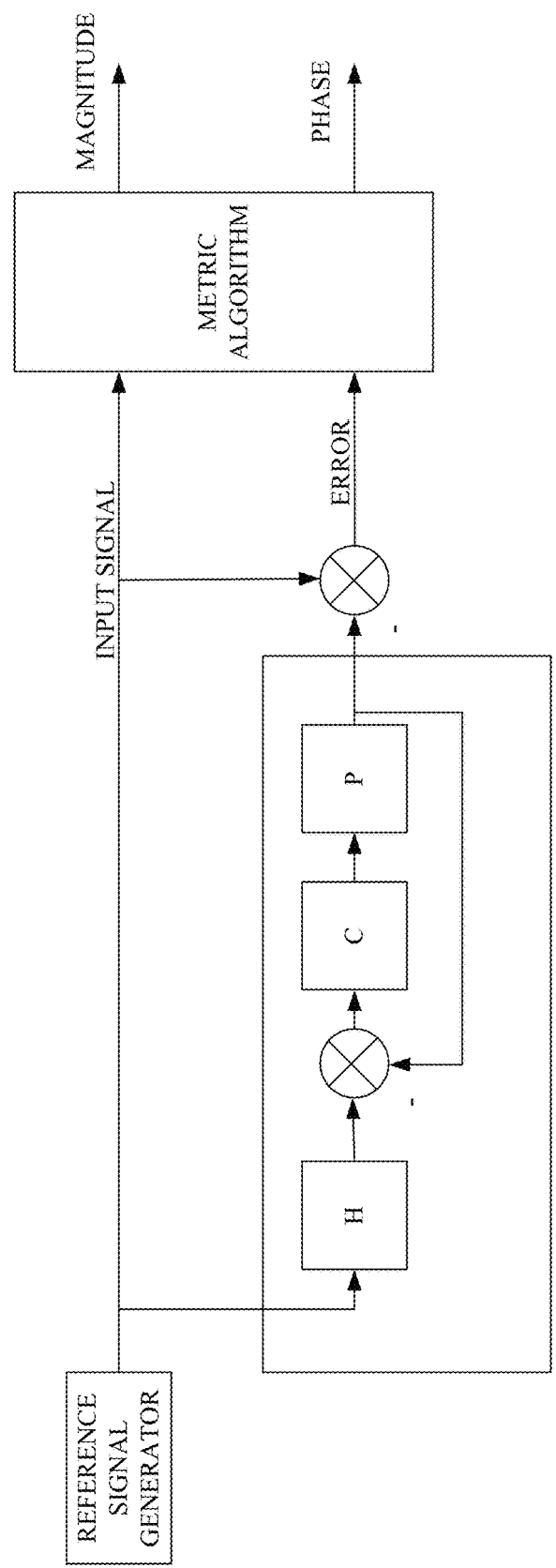
FIG. 10 is a block diagram of a generalized configuration for generating a tracking error response Bode plot.

FIG. 10 illustrates a block diagram of a generalized configuration for generating a tracking error frequency response Bode plot. As shown in this configuration, the Bode plot is generated based on the input signal and the error, which is the difference between the input signal and the measured output of the plant P for a closed-loop control configuration. Thus, the tracking error frequency response is closely related to the closed-loop transfer function T, as shown below:

$$S = 1 - T \leftrightarrow T = 1 - S \tag{2}$$

As with the other example responses described above, the example plot illustrated in FIG. 7 represents the tracking error frequency response for position. However, the tracking error frequency response can also be derived for velocity, current, or other controlled aspect.

Figure 11:
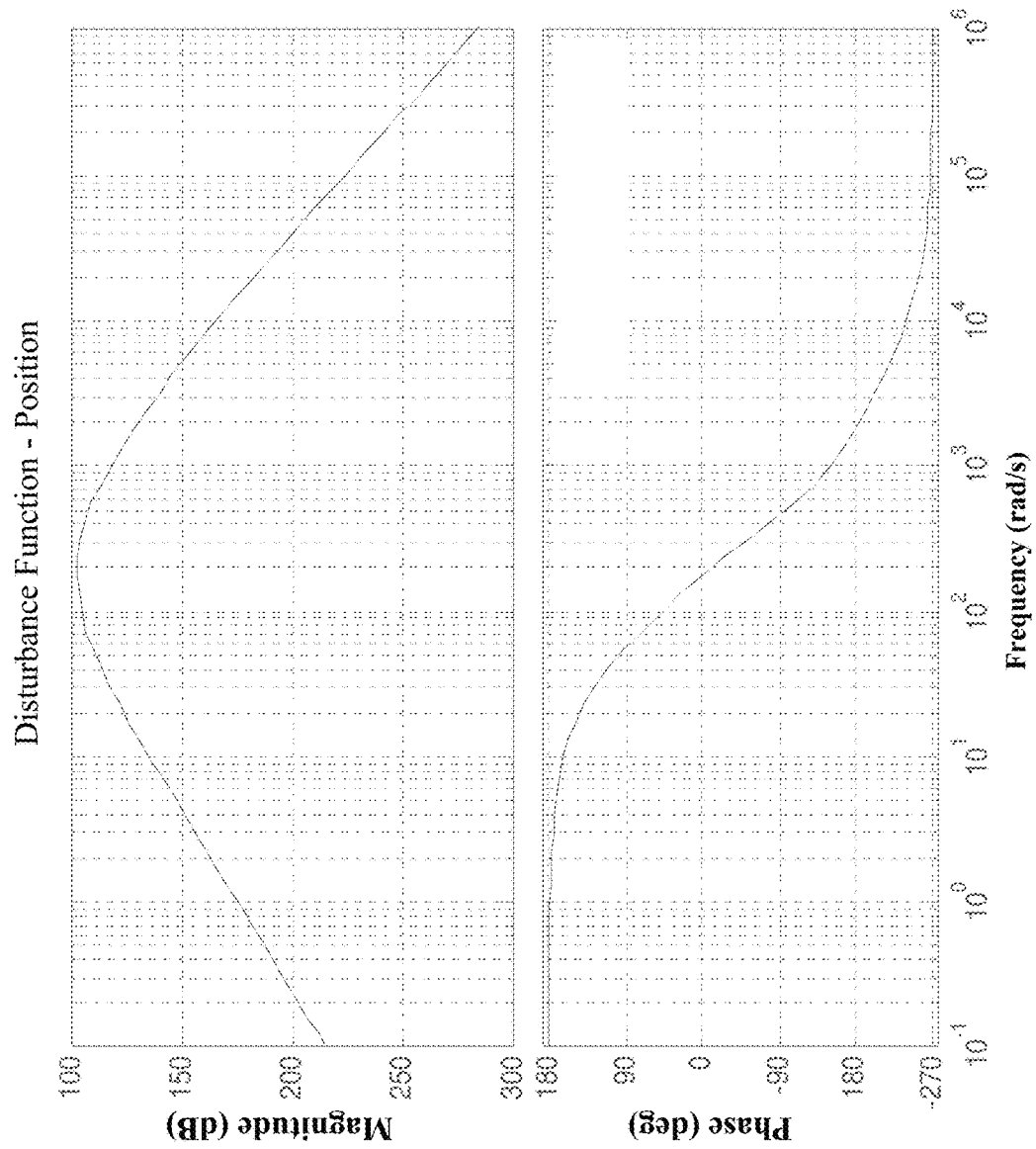
FIG. 11 is a plot of an example disturbance rejection response.

FIG. 11 illustrates an example disturbance rejection frequency response. This metric measures position and velocity tracking errors that result from internal and external disturbances. The disturbance rejection metric characterizes the stiffness and robustness of a system to external disturbances and load perturbations. The disturbance rejection frequency response can be used to ensure that the controlled machine operates robustly to load changes, external disturbances, machine wear over time, mechanical manufacturing tolerances, and environmental variations (e.g., temperature and pressure changes).

The disturbance rejection frequency response D can be characterized as $$D = \frac{P}{1+L} \quad (3)$$

and represents the transfer function between a torque disturbance and the position or velocity error. In terms of performance metrics, the disturbance rejection frequency response identifies the closed-loop tracking error as a function of disturbance frequency. In other words, the disturbance rejection frequency response is an indicator of how sensitive a system is to external disturbances and plant perturbations, which is a measure of how much a drive or other controller with a given set of gains can force a mechanical load to behave consistently under adverse conditions. The more consistent a controlled plant behaves, the less variation is added to the command response and tracking error. Lower amplitudes for the position or velocity errors in the disturbance rejection frequency response metric indicate better performance.

Figure 12:
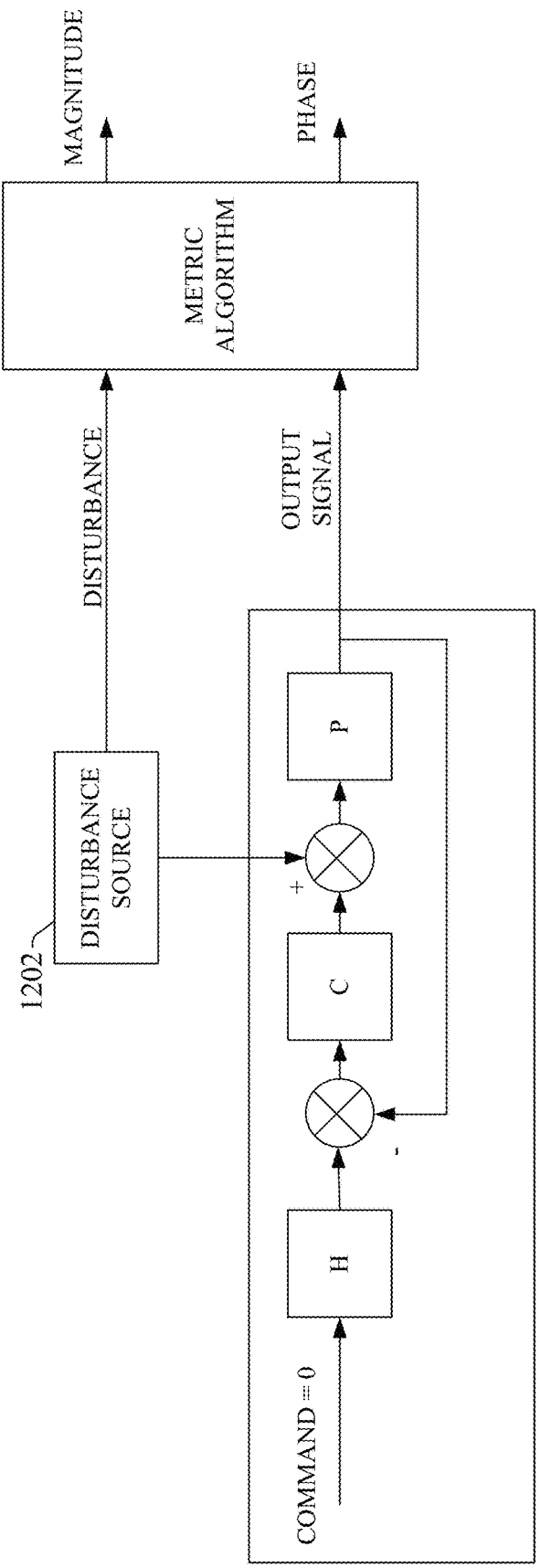
FIG. 12 is a block diagram of a generalized configuration for generating a disturbance rejection response Bode plot.

FIG. 12 illustrates a block diagram of a generalized configuration for generating a disturbance rejection frequency response Bode plot. As shown in this figure, a disturbance source 1202 places a disturbance (e.g., a load or weight change, a disturbance due to environmental changes or machine wear, etc.) on the system, which must be compensated for by the controller C based on the feedback (output signal) measured from the plant. The disturbance rejection frequency response Bode plot is based on the disturbance and the output signal. In the example configuration illustrated in FIG. 12, an input disturbance (fed to the input side of plant P) is used, which generates a disturbance rejection frequency response characterized by D=P/(1+L). The input disturbance is used instead of an output disturbance, which generates a disturbance rejection frequency response characterized by D=1/(1+L). The input disturbance is used because the effects of pole-zero cancellation are not visible in an output disturbance rejection Bode plot, but are visible on an input disturbance rejection Bode plot due to the lone P term in the numerator. The reason is that pole-zero cancellation creates unobservable and/or uncontrollable modes, yielding a characteristic equation not strong enough to negate disturbances or plant variations in P.

The disturbance rejection frequency response Bode plot illustrated in FIG. 11 was derived for position, with the drive in position mode and the position command set to zero during measurement. This allows the position loop stiffness and robustness of the system to be determined Similar techniques can be used to derive disturbance rejection frequency response Bode plots for velocity or other controlled aspects.

Table 1 below summarizes the four frequency responses described above in terms of their associated drive performance metrics and usability:

TABLE 1

Frequency Responses and Associated Performance Metrics

| Freq. Response | Metric | Usability |
| --- | --- | --- |
| Open-Loop Response | Zero-Crossing Bandwidth Gain Margin Phase Margin | Tuning Identify Resonances Fair Drive Comparison |
| Closed-Loop Response | System Bandwidth | Predict Position and Velocity Error and Torque Measure of overall system performance |
| Tracking Error Response | Position and Velocity Error as a function of Frequency | Classify and compare drives by performance level Drive Specification Determine whether drive meets machine specification |
| Disturbance Rejection Response | Position and Velocity Error as a function of Load Disturbance | Measure system robustness |

One or more embodiments of the present disclosure provide techniques for deriving accurate results for the four response metrics described above in order to obtain a broadly applicable, generalized performance signature for a given motor drive. Among other benefits, the disclosed techniques yield performance metrics that are broadly applicable over a wide range of industrial applications and mechanical loads, and facilitate a fair comparison of drive performance across different motor drives. In some scenarios, drive manufacturers can leverage the disclosed techniques during in-house testing of their drive products to obtain generalized performance metrics that can be published with the drive specifications to assist end users with making an informed selection of a suitable motor drive for their unique industrial applications. For example, drive manufacturers can derive "text book" performance results for inclusion in the drive's documentation by performing the disclosed frequency response testing on a range of rigid systems and curve fitting the results. Since the frequency response analysis tools and test routines for deriving the performance metrics can be implemented in the drive itself (e.g., embodied in the drive's firmware), end users can also run their own performance tests to generate customized performance metrics that are specific to the end user's particular industrial application. Certain key aspects of the frequency response analysis tools are described in more detail below.

Figure 13:
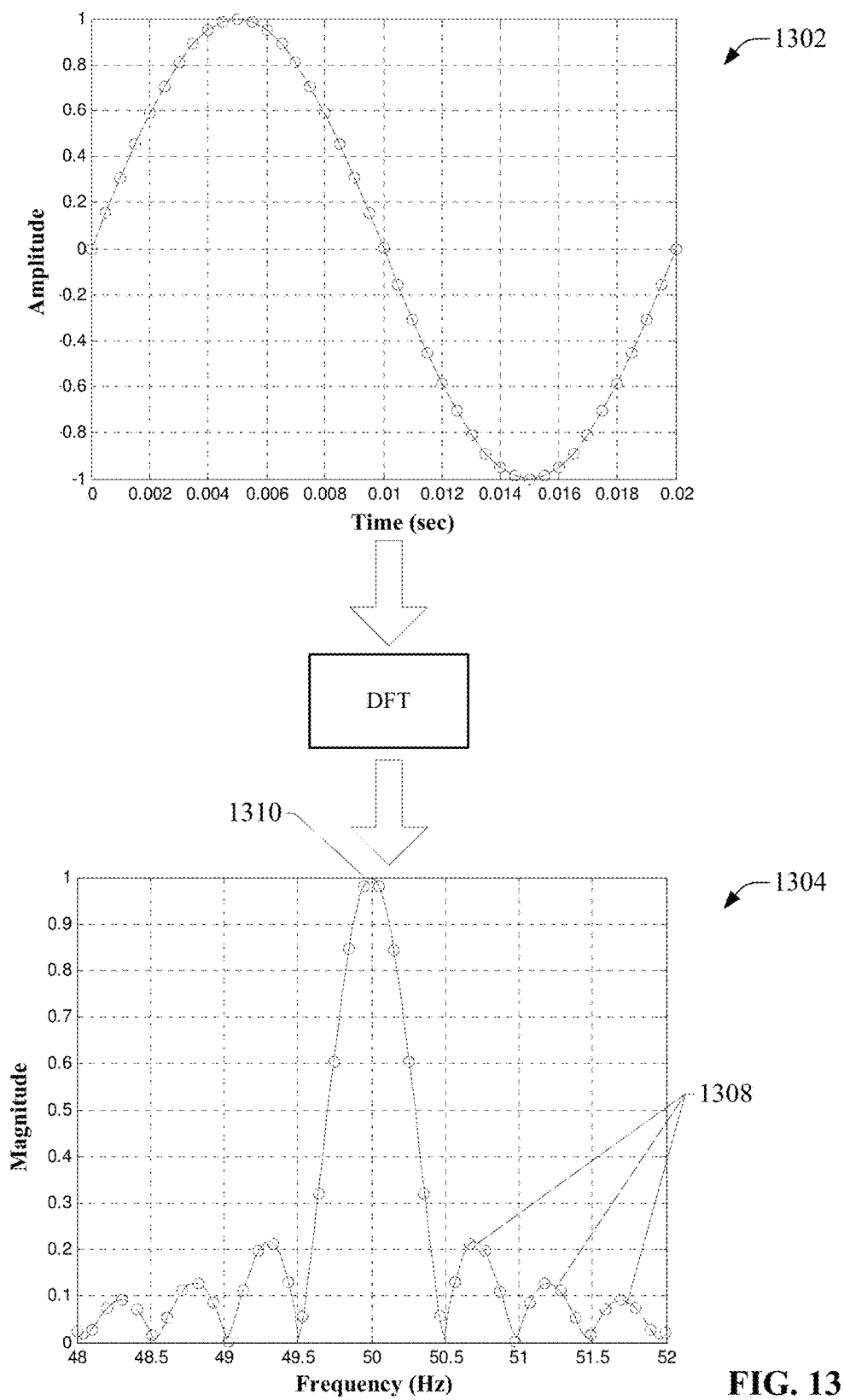
FIG. 13 is a plot illustrating spectral leakage associated with conventional discrete Fourier transforms (DFTs).

In one or more embodiments, the frequency response analysis tools can include an Exact Discrete Fourier Transform and Exact Fast Fourier Transform (Exact DFT/FFT) that reduces or eliminate spectral leakages and reduces computation time required to generate the frequency responses of the system. FIG. 13 illustrates the problem of spectral leakage associated with conventional DFT. Standard DFT algorithms transform an N point discrete time signal x(n) into a complex vector X(k) (a frequency-domain signal) containing magnitude and phase information for k evenly spaced frequency bins between 0 Hz and the sampling frequency. The frequency-domain signal can be characterized as:

$$X(k) = \frac{2}{N}\sum_{n=1}^{N} x(n)e^{-j2\pi(k-1)(n-1)/N}, \quad (4)$$

$$k = 1, \ldots, N/2$$

Since aliasing occurs above half the sampling frequency, X(k) typically contains k=N/2 evenly spaced frequencies between 0 Hz and the Nyquist frequency. For the sake of clarity, T is the sampling period, n=1, 2, . . . , N is the time index of the input time steps (n)=nT, and k=1, 2, ..., N/2 is the frequency index of the frequency bins f(k)=(k−1)/(NT) in Hz.

When transforming a time-domain signal to a frequency-domain signal using conventional DFT, the number of frequency bins and their linear spacing are functions of the number of time samples N. However, since the N time samples and their associated frequency bins are evenly spaced between zero and the Nyquist frequency, a given frequency component of a signal may not perfectly align with any of the evenly spaced frequency bins, resulting in measurement errors known as spectral leakage. This is illustrated in FIG. 13, in which a 50 Hz sinusoidal time-domain signal 1302 is sampled at a defined sampling period to yield a number of evenly spaced frequency bins 1306. If the 50 Hz frequency of the sinusoidal signal does not perfectly align with a DFT frequency sample, the frequency-domain signal 1304 will include a number of inaccurate non-zero values 1308 at frequencies near the 50 Hz frequency. These extra frequency components represent undesirable spectral leakage.

One approach to mitigating spectral leakage is to increase the number of data samples N to get a better resolution with the frequency bins k. However, this solution increases the computational intensity, because the DFT is evaluated $(N^2)/2$ times to sum N samples for N/2 frequencies. Another alternative is to use a more complex Fast Fourier Transform (FFT). The FFT reduces the computational complexity but is still computationally intensive as the number of samples increases.

These drawbacks of conventional DFT/FFT approaches are avoided using the Exact DFT described herein, which reduces computation time, reduces or eliminates spectral leakages, obviates the need to increase the number of data samples, and eliminates the need for FFT approaches. These benefits are achieved by decoupling the analyzed frequency from the number of time samples using an arbitrary non-uniform spacing between the frequency bins.

Figure 14:
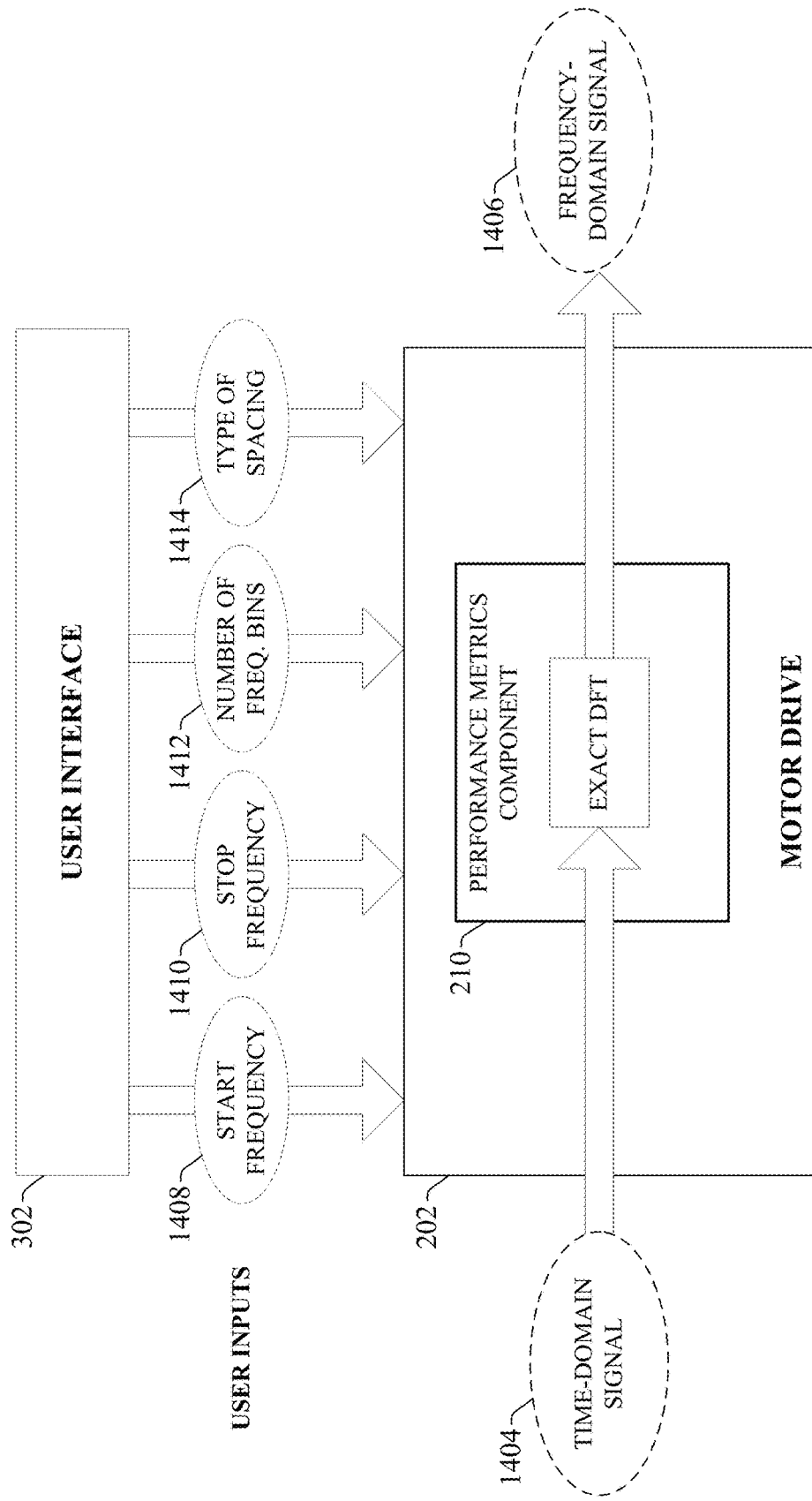
FIG. 14 is a block diagram of an example motor drive with an integrated performance metrics component that employs an Exact DFT.

FIG. 14 illustrates an example motor drive with an integrated performance metric component 210 that employs the above-described Exact DFT. In one or more embodiments, the frequency response analysis tools associated with the performance metric component 210 allow a user to enter parameters for the Exact DFT analysis via user interface 302. These user inputs include start frequency 1408, stop frequency 1410, a desired number of frequency bins 1412, and a selected type of spacing 1414 (e.g., linear, logarithmic, etc.). The start frequency 1408 and stop frequency 1410 define the frequency range for the DFT analysis. The number of frequency bins 1412 specifies the number of frequency bins to be defined within the specified frequency range (between the start and stop frequencies). The type of spacing 1414 defines whether the frequency bins will be spaced according to a linear spacing, a logarithmic spacing, or other suitable type of spacing. Based on these user-defined parameters, the Exact DFT will perform a modified DFT analysis on a given time-domain signal 1404 by generating the specified number of frequency bins between the indicated frequencies such that the frequency bins have an arbitrary non-uniform spacing specified by user selection (e.g., a band-limited logarithmic scale or custom frequency scale). By allowing the user to define the frequency range of interest as well as the number and spacing for the frequency bins, a frequency bin can be made to align with the frequency component of the signal, resulting in a frequency-domain signal 1406 that is free or substantially free of spectral leakage.

Figure 15:
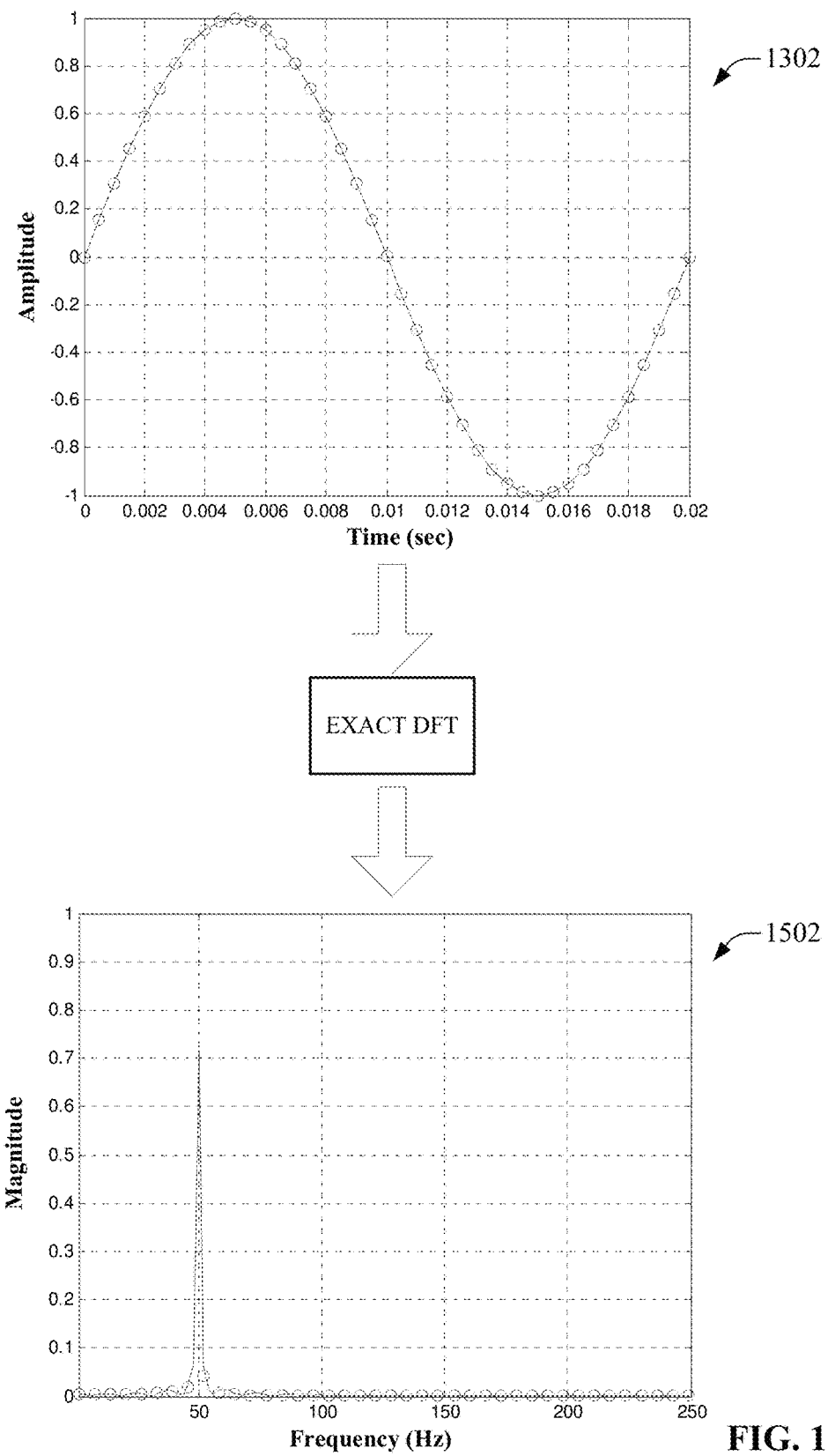
FIG. 15 are plots depicting transformation of a 50 Hz sinusoidal time-domain signal to the frequency-domain using an Exact DFT.

FIG. 15 illustrates transformation of the 50 Hz sinusoidal time-domain signal 1302 of FIG. 13 to the frequency-domain using the above-described Exact DFT to yield a frequency-domain signal 1502 that is free of spectral leakage. As can be seen in this figure, by allowing the user to focus the desired frequency range for the Exact DFT analysis narrowly around the 50 Hz frequency component (e.g., from 48 Hz to 52 Hz), and by allowing uneven spacing of frequency bins, the 50 Hz frequency component is made to align with one of the resulting frequency bins, resulting in a frequency-domain signal 1502 that accurately conveys a single 50 Hz component without spectral leakage.

By eliminating spectral leakages and reducing computational time, the Exact DFT can be a key component of the frequency response analysis tools used to derive the drive performance metrics described above. To this end, the Exact DFT can be implemented in the drive's firmware as part of the performance metric component 210 to facilitate generation of the frequency response curves for open-loop, closed-loop, error tracking, and disturbance rejection.

An example implementation for the Exact DFT is now described. It is to be appreciated that the particular techniques described below for implementing the Exact DFT are not intended to be exclusive, and that any suitable technique for generating a specified number of unevenly spaced frequency bins between defined start and stop frequencies is within one or more embodiments of this disclosure.

In one or more embodiments, an Exact DFT suitable for use in determining performance metrics for a drive can be obtained by replacing (k−1)/N in equation (4) above with an equivalent fT in the exponent. This substitution allows the DFT to be evaluated precisely at any one input frequency f:

$$X(f) = \frac{2}{N} \sum_{n=1}^{N} x_{nom}(n) e^{-j2\pi fT(n-1)} \quad (5)$$

This allows an arbitrary number of frequency bins to be defined with arbitrary non-uniform spacing (i.e., band-limited and logarithmic scales). This eliminates spectral leakage, the need to increase the number of time samples N, and consequently the need for an FFT. By decoupling N and k, the magnitude, phase, and frequency measured are no longer functions of k. Instead, the magnitude and phase are direct functions of the frequency measured f(k), where k is an index to loop through the algorithm for k frequencies:

$$X(k) = \frac{2}{N} \sum_{n=1}^{N} x_{nom}(n) e^{-j2\pi f(k)T(n)}, \quad (6)$$

$$k = 1, \ldots, K$$

Note that nominal values $(x_{nom})$ are used for x(n) in this example.

With a user-defined start frequency, stop frequency, and number of frequencies k, a band-limited set of linear frequency bins is defined with $f(1) = f_{start}$:

$$f(k) = f(k-1) + f_{interval}, \quad (7)$$

$$k = 2, \ldots, K$$

-continued $$f_{interval} = \frac{f_{stop} - f_{start}}{K - 1} \qquad (8)$$

The linear spacing works well for identifying resonances and anti-resonances, which could be located anywhere along the frequency range.

A band-limited set of log frequency bins can also be defined with $f(1)=f_{start}$:

$$f(k) = f(k-1) * f_{interval}, \qquad (9)$$
$$k = 2, \ldots, K$$

$$f_{interval} = \left(\frac{f_{stop}}{f_{start}}\right)^{\frac{1}{K-1}} \qquad (10)$$

Depending on the user selection of the type of frequency bin spacing, equations (6), (7), and (8) above can be used to generate the frequency bins for a linear scaling, while equations (6), (9), and (10) can be used to generate the frequency bins for a logarithmic scaling. These example formulas for an Exact DFT analysis can therefore be implemented in the drive firmware (e.g., as part of the performance metric component 210) in one or more embodiments.

Nominal values $x_{nom}$ are computed by subtracting the average value $x_{ave}$ from time samples $x(n)$ and then applying a window function $W_{in}(n)$. This results in a more precise computation of $X(k)$:

$$x_{nom}(n) = (x(n) - x_{ave}) W_{in}(n) \qquad (11)$$

Subtracting the signal average (e.g., the DC value) also works well and yields high accuracy. In this scenario, there is no need for $f_{start}$ to go to zero since the DC value is subtracted out.

$$x_{ave}(n) = \frac{1}{N}\sum_{n=1}^{N} x(n) \qquad (12)$$

In one or more embodiments, the Exact DFT techniques described above can be implemented in motor drive firmware (e.g., as part of performance metric component 210, as illustrated in FIG. 14) to allow the drive to generate accurate frequency response curves without spectral leakage and with reduced computational overhead. In addition to its utility in generating drive performance metrics, these Exact DFT techniques can be useful in a wide range of other applications. For example, in condition monitoring applications, such as preventative maintenance of a drive-motor, peak detection code of specified frequencies can be applied to the resulting frequency response to identify the location of relative peaks, which may dictate when maintenance should be performed. In another example, the Exact DFT can be used in applications to identify resonances by applying frequency detection code of peaks to the frequency response.

It is to be appreciated that the particular equations discussed above for implementing the Exact DFT are intended to be exemplary, and that any suitable technique for generating unevenly spaced frequency bins for a frequency-response curve based on a user-specified start frequency, stop frequency, desired number of frequency bins, and spacing type is within the scope of one or more embodiments of this disclosure.

An extension of the Exact DFT is an Exact FFT, which recursively breaks down the DFT into smaller, more computationally efficient components.

As noted above, motor drive 202 in FIG. 16 includes a signal generator component 208 that generates the input signal delivered to the motor/mechanical load during performance metric testing. According to another aspect that facilitates generation of drive performance metrics within a motor drive, signal generator component 208 can be configured to generate the input signal in accordance with the input parameters provided by the user, as well as internal signal generating algorithms that scale the input signal's amplitude as a function of test frequency in order to mitigate noise issues and avoid saturation. In particular, signal generator component 208 can scale the amplitude of the generated sine wave signal for each test frequency as a function of the limits of the drive as well as user-defined system limits. This scaling enables large signal analysis to mitigate noise issues, and avoids saturation by keeping the drive and motor within position, velocity, and acceleration limits as the excitation frequency increases, as explained further below.

Typically, to produce a Bode plot, an input signal is generated and applied to the input U to excite the mechanical system (e.g., motor plus load). When the signal is a sine wave, the input and output are measured precisely at the sine wave's frequency. This process is then repeated at multiple frequencies. If the sine wave is generated to maintain a constant amplitude A as the frequency ω is increased, the amplitude of its derivative (velocity) will increase as a function of ω and the amplitude of its double derivative (acceleration and torque) will increase as a function of $\omega^2$, as illustrated by the position, velocity, and acceleration equations below:

$$\text{Position} = A \sin(\omega t) + V_0 t \qquad (13)$$

$$\text{Velocity} = A\omega \cos(\omega t) + V_0 \qquad (14)$$

$$\text{Acceleration} = -A\omega^2 \sin(\omega t) \qquad (15)$$

These increasing amplitudes can quickly exceed the limits of the drive as the input signal frequency is increased, causing saturation and consequently invalid frequency response results. To mitigate these issues, some conventional solutions generate a sine wave signal having a constant amplitude that is low enough to ensure that the amplitudes of the signal's derivative and double derivative do not saturate the system (e.g., the noise floor). However, this may result in a sine wave signal having an amplitude that is much lower than necessary at lower frequencies, which could compromise the results of the analysis.

Therefore, to avoid saturation issues without sacrificing the integrity of the analysis, one or more embodiments of the signal generator component 208 can be configured to scale the frequency components of the input signal to ensure that their magnitudes to not excite the system beyond its position, velocity, and acceleration limits as the excitation signal frequency increases. These limits can be defined by the user and provided to the drive via user interface 302 in order to allow for adjustment in operating point. In general, when a sine wave input signal is to be applied to a controlled mechanical system in order to determine the frequency responses and performance metrics described above, the signal generator component 208 determines a maximum signal amplitude for each frequency that will ensure that the system is not saturated, and appropriately scale the input signal as a function of frequency based on these determinations. Additionally, the signal generation component 208 can adjust frequency components in close proximity to the Nyquist frequency to avoid aliasing errors. Thus, rather than using a low amplitude sine wave for all frequencies, the signal generation component computes, for each frequency being analyzed, the highest magnitude for the sine wave excitation signal that will not saturate the system given the motor drive limits and user-defined limits.

Figure 16:
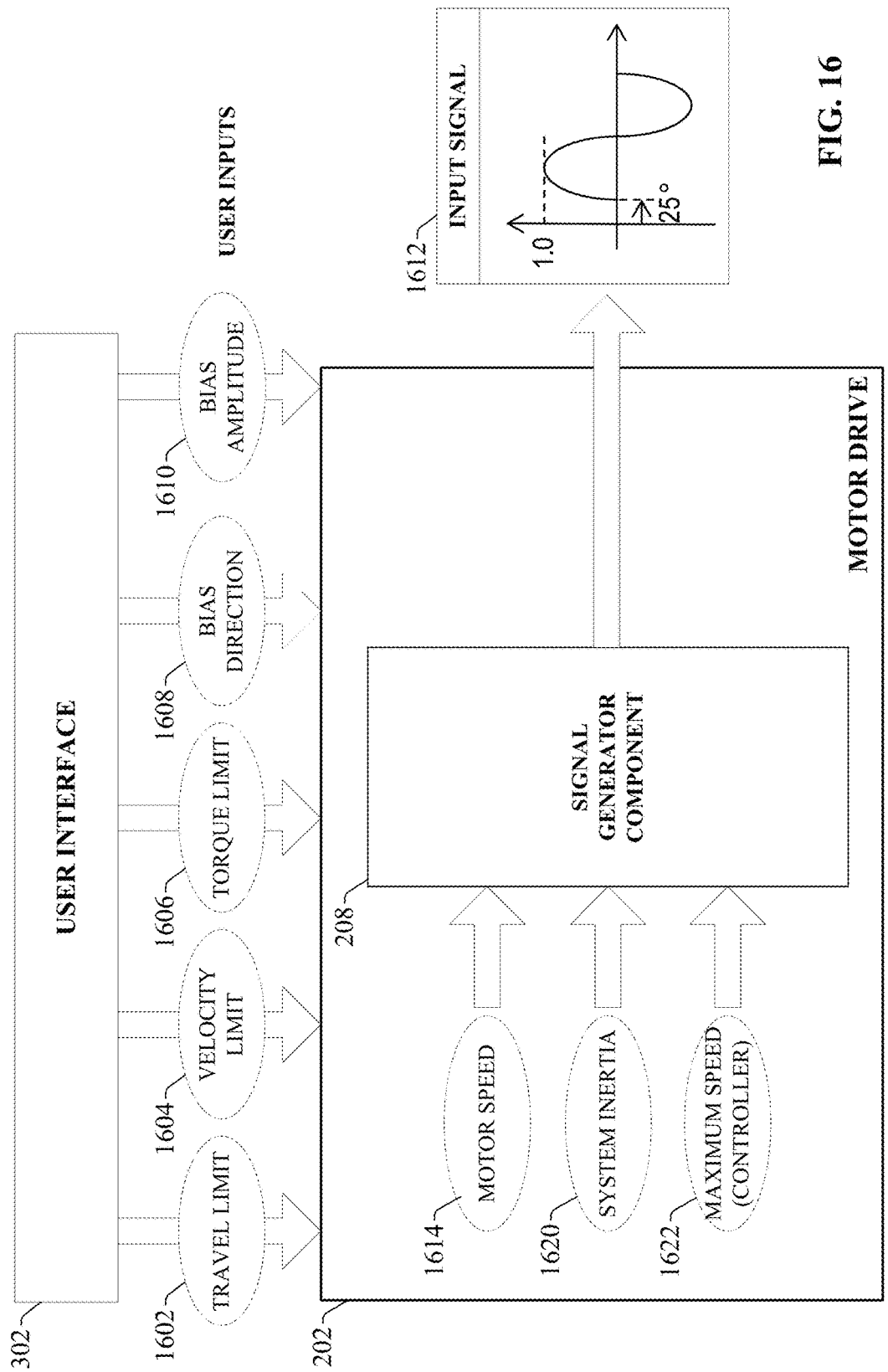
FIG. 16 is a block diagram of an example signal generator component for scaling an input signal as a function of frequency based on user-defined system limits and drive-dependent parameters.

FIG. 16 illustrates an example signal generator component 208 for scaling an input signal 1612 as a function of frequency based on user-defined system limits and drive-dependent parameters that are specific to drive 202. In one or more embodiments, the user can enter (via user interface 302) application-specific parameters that define the limits of the mechanical system (motor and load) being controlled. These user-defined parameters can include travel limit 1602 (e.g., defined in motor revolutions), velocity limit 1604 (e.g., defined as a % of maximum), torque limit 1606 (e.g., defined as % of maximum), bias direction 1608 (either positive or negative direction), and bias amplitude 1610 (e.g., defined as % of maximum). Signal generator component 208 will scale the input signal 1612 as a function of these user-defined limits, as well as drive-dependent parameters and/or controller-dependent parameters that are particular to the type of motor drive 202 generating the signal. The drive-dependent parameters can be encoded in the drive's firmware, or otherwise stored in drive memory, and correspond to the drive's specifications and ratings. For configurations in which the drive 202 operates under the control of an industrial controller (e.g., industrial controller 108 of FIG. 1), controller-dependent parameters can comprise operational limit values associated with the controller. In an example embodiment, the drive-dependent parameters can include rotary rated speed 1614 (defined in revolutions per minute), and system inertia 1620 (e.g., defined as kg-m$^2$). Maximum speed 1622 (defined as revolutions per second) represents an example controller-dependent value.

Based on these user-defined limits and the drive-dependent parameters, the signal generator component 208 can determine the input signal limits as follows. The maximum position maxPos (e.g., in motor revolutions) corresponds to the user input velocity limit 1604:

$$\text{maxPos} = \text{Travel Limit [revs]} \quad (16)$$

The maximum velocity maxVel (in revolutions/second) is a function of user input velocity limit 1604 (in % of maximum) and drive parameter motor speed 1614 (in RPM). The motor speed [RPM] may be a nameplate speed parameter.

$$\text{maxVel} = \frac{\text{Motor Speed}}{60} * \frac{\text{Velocity Limit}}{100} \left[\frac{revs}{\sec}\right] \quad (17)$$

The maximum acceleration maxAcc (in rev/sec$^2$) is a function of user input torque limit 1606 (in % of maximum), rated torque (N-m), and system inertia (kg-m$^2$):

$$\text{maxAcc} = \frac{\text{Rated Torque}}{\text{System Inertia} * 2\pi} * \frac{\text{Torque Limit}}{100} \left[\frac{revs}{\sec^2}\right] \quad (18)$$

Bias direction 1608 is a user input that defines either positive or negative direction, and may comprise a binary value that is equal to 0 for positive direction or 1 for negative direction. The bias amplitude 1610 is a user input (% of maximum) that must be limited between 0% and 150%. When bias amplitude=0, no bias is applied to the sinusoidal command. Increasing the bias amplitude between 0 and 150 will increase the bias placed on the sinusoidal input command while decreasing the sine wave amplitude in order to keep the input from exceeding the maximum travel, velocity, and torque limits. When bias amplitude is equal to 100, the peak-to-peak sine wave (velocity signal) operates between zero and the maximum velocity limit (maxVel), ensuring that the command does not reverse direction. When the bias amplitude is equal to 150, the peak-to-peak sine wave operates between half the maximum velocity limit and the maximum velocity limit.

With these user-defined and drive-dependent parameters established, the manner in which the signal generator component 208 scales the sinusoidal input signal may depend on the type of analysis desired; that is, which of the four frequency responses described above (open-loop, closed-loop, tracking error, or disturbance rejection) the user wishes to generate, and whether the selected frequency response should be performed for position, velocity, or current.

In some embodiments, the user may also elect to perform a plant identification analysis, which produces a frequency response that characterizes the plant transfer function P. In motion systems, the plant consists of the power converter, motor, mechanical load, and non-ideal feedback device. In general, the mechanics dictate the dynamic behavior of the system. In terms of metrics, the Bode plot P can be used to initially tune the controller or to design better mechanics. The plant identification Bode plot identifies the location and spacing of resonances and anti-resonances in the mechanics. This information can be used to determine torque scaling, system inertia, load ratio, whether the load is rigid or compliant, or how difficult the system is to tune. Yet another analysis type—torque reference filters—may also be performed in some embodiments. A torque reference filters Bode can be used to test firmware code across the torque reference filters (i.e., low pass and notch filters), since these Bode responses are well known Table 2 below summarizes the analysis types that can be performed by the performance metrics component:

TABLE 2

| Analysis Types | |
|---|---|
| Enumeration | Analysis Type |
| 0 | Plant Identification |
| 1 | Open Loop Position |
| 2 | Open Loop Velocity |
| 3 | Closed Loop Position |
| 4 | Closed Loop Velocity |
| 5 | Closed Loop Current |
| 6 | Tracking Error Position |
| 7 | Tracking Error Velocity |
| 8 | Disturbance Rejection Position |
| 9 | Disturbance Rejection Velocity |
| 10 | Torque Reference Filters |

For open-loop velocity, closed-loop velocity, and tracking error velocity analysis, where the signal generator component 208 applies a velocity command, a constant bias (biasVel) can be applied to the sinusoidal velocity command.

For open-loop position, closed-loop position, and tracking error position analysis types, where the signal generator component 208 applies a position command, a ramp bias (biasVel*time) can be applied to the sinusoidal position command.

For plant identification, closed-loop current, disturbance rejection position, disturbance rejection velocity, and torque reference filters analysis types, where the signal generator component 208 is applied as a current or torque command, no velocity bias is applied and bias amplitude 1610 must be set to zero internally so that the sine wave amplitude is not decreased.

Equivalence is formulated between maximum amplitudes in position, velocity, and acceleration, according to equation (19) below:

$$A\omega^2 = \text{maxAcc} = \text{maxVel}*\omega = \text{maxPos}*\omega^2 \quad (19)$$

Frequency break points $F_1$, $F_2$, and $F_3$ (in Hertz (Hz)) are calculated from this equivalence, as follows:

$$F_1 = \frac{\text{maxVel}}{2\pi * \text{maxPos}} [\text{Hz}] \quad (20)$$

$$F_2 = \frac{\text{maxAcc}}{2\pi * \text{maxVel}} * \frac{1}{1 - \text{BiasAmplitude}/200} [\text{Hz}] \quad (21)$$

$$F_3 = \frac{1}{2\pi} \sqrt{\frac{\text{maxAcc}}{\text{maxPos}}} * \frac{1}{1 - \text{BiasAmplitude}/200} [\text{Hz}] \quad (22)$$

There are two possible situations for limiting the position, velocity, and acceleration based on the results for $F_1$, $F_2$, and $F_3$.

(1) When $F_2 > F_1$, position amplitude must be limited below $F_1$, velocity amplitude must be limited between $F_1$ and $F_2$, and acceleration amplitude must be limited above $F_2$.

(2) When $F_2 < F_1$, there is no region where velocity amplitude must be limited and $F_3$ is used. Here, position amplitude must be limited below $F_3$ and acceleration amplitude must be limited above $F_3$.

The second situation can be accounted for in the first situation by making $F_1 = \min(F_1, F_3)$.

The following logic can be used by the signal generator component 208 to calculate the amplitude A of the sine wave (in revolutions):

if $F < F_1$ & $F < F_3$ Then $A = \text{maxPos} * \text{Direction} * (1 - \text{BiasAmplitude}/200)$ Else if $F < F_2$ Then $A = \text{maxVel}/\omega * \text{Direction} * (1 - \text{BiasAmplitude}/200)$ Else $A = \text{maxAcc}/\omega^2 * \text{Direction}$ The sine wave magnitude calculated by the signal generator component 208 based on these relationships may depend on the type of drive that is performing the test. In general, the signal generator component 208 will generate the input signal to have a magnitude equal to magPos when the sine wave is applied to a position loop signal, such as a position command. The sine wave magnitude will be equal to magVel when the sine wave is applied to a velocity loop signal, and will be equal to magTrq when the sine wave is applied to a torque loop signal. The signal generator component 208 calculates magPos, magVel, and magTrq as follows:

$$\text{magPos} = A \text{ [rev]} \quad (23)$$

$$\text{magVel} = A\omega \text{ [rev/sec]} \quad (24)$$

$$\text{magTrq} = A\omega^2 * \text{System Inertia [Nm]} \quad (25)$$

Figure 17:
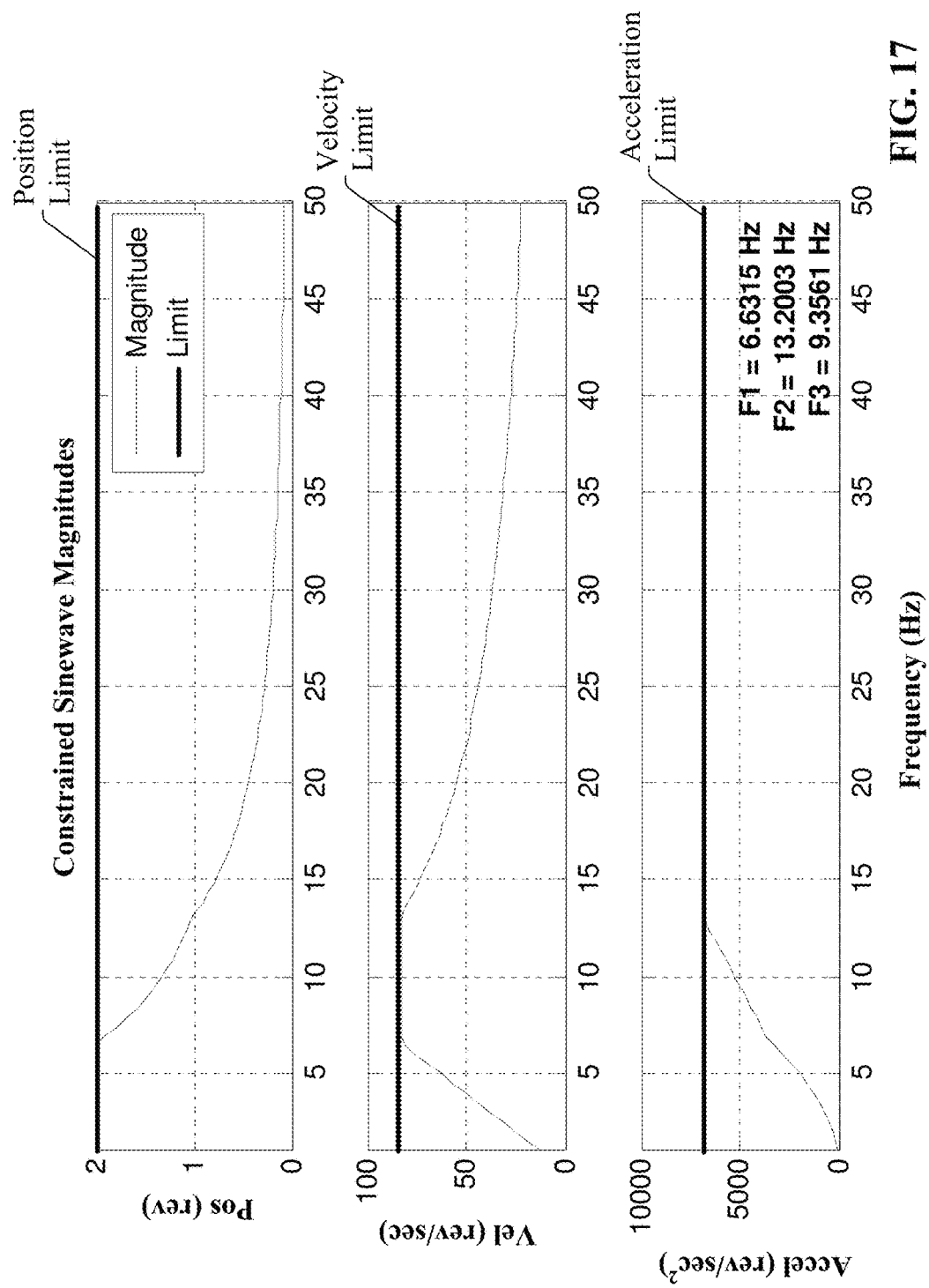
FIG. 17 is a set of plots of sine wave magnitudes for position, velocity, and acceleration as a function of frequency for an example drive and motor.
Figure 18:
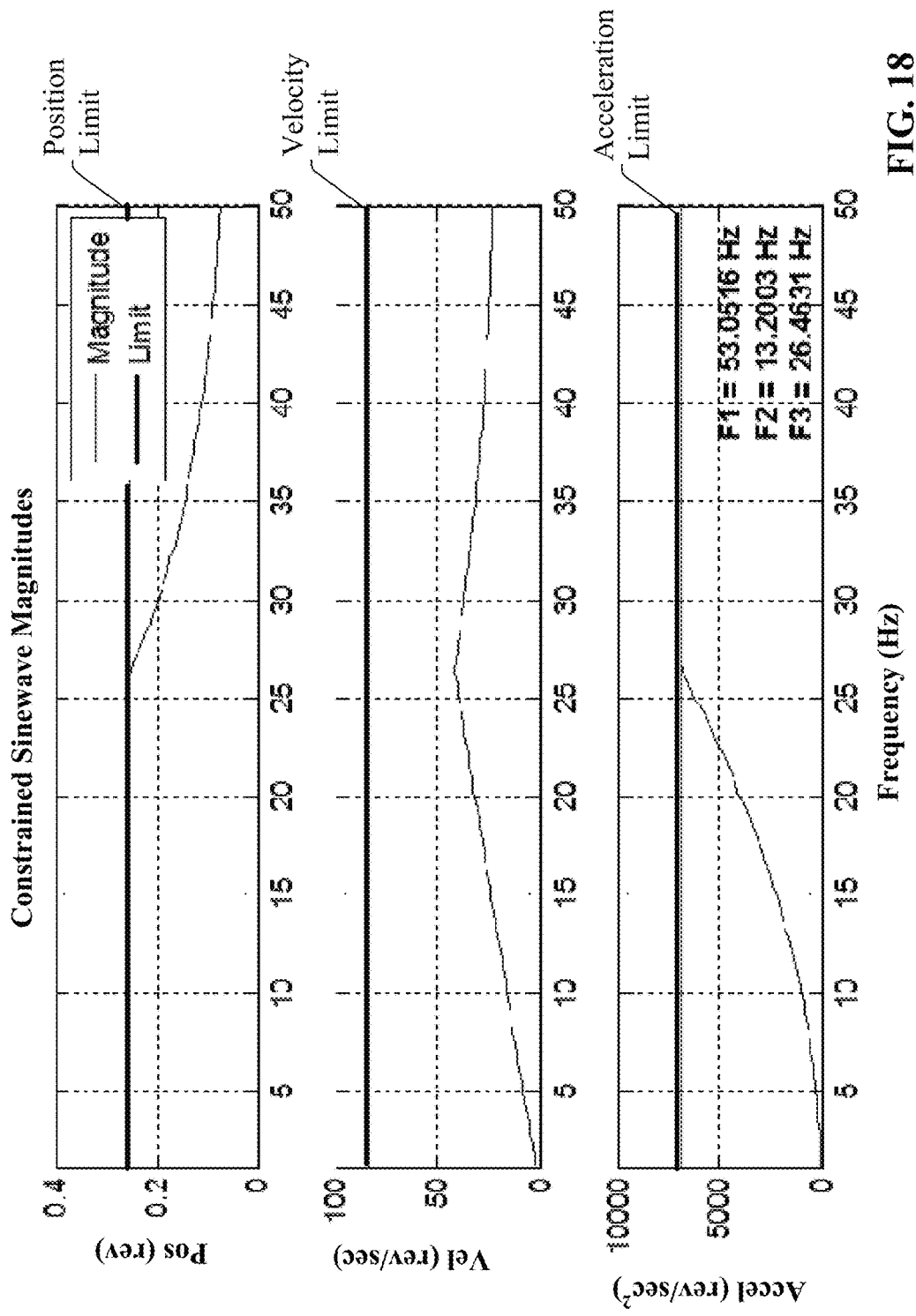
FIG. 18 is a set of plots of constrained sine wave magnitudes generated based on defined system limits to avoid saturation.

FIG. 17 illustrates sine wave magnitudes for position, velocity, and acceleration as a function of frequency for an example drive 202 and motor with a load ratio of zero. In this example, $F_1 < F_2$ when the user-defined parameter travel limit=2 revolutions, velocity limit=100%, and torque limit=100%. However, $F_1 < F_2$ when travel limit=0.25 revolutions, resulting in the sine wave magnitudes depicted in FIG. 18. During frequency response testing, the signal generator component 208 will generate the input signal 1612 such that the magnitude follows these magnitude constraints as the frequency is increased, thereby generating an input signal having, at any given frequency, a substantially maximum amplitude for that frequency without exciting the mechanical system beyond its limits.

Signal generator component 208 calculates the velocity bias biasVel to counteract viscous friction and backlash:

$$\text{biasVel} = \text{magVel} * \frac{\text{BiasAmplitude}}{200 - \text{BiasAmplitude}} [\text{magVel units \& sign}] \quad (26)$$

With the drive 202 in Position mode, a ramp bias (biasVel*time) can be applied to the sinusoidal position command:

$$\text{Position Signal} = \text{magPos} * \text{SIN}(\omega t) + \text{biasVel} * t \quad (27)$$

When the drive 202 is in Velocity mode, a constant biasVel is applied to the sinusoidal command:

$$\text{Velocity Signal} = \text{magVel} * \text{SIN}(\omega t) + \text{biasVel} \quad (28)$$

When the drive 202 is in Torque mode, no bias is applied to the sinusoidal velocity command:

$$\text{Torque Signal} = \text{magTrq} * \text{SIN}(c\omega t) \quad (29)$$

The formulas above for Position Signal, Velocity Signal and Torque Signal (as well as appropriate maximum magnitude formulas for magPos, magVel, and magTrq), can be implemented by signal generator component 208 within the drive to facilitate appropriate scaling of the input signal 1612 as a function of frequency during frequency response testing to avoid saturation of the system, based on the drive-dependent parameters and user-provided system limits.

According to another aspect that facilitates accurate measurement of phase during frequency response testing, one or more embodiments of the frequency response analysis tools described herein can facilitate phase unwrapping to mitigate inaccurate phase measurements, particularly at high phases. Using conventional frequency response generating methods, the resultant frequency response plot may include incorrect phase jumps at points that are not resonance points due to mathematical anomalies. Some phase unwrapping solutions can only unwrap the phase up to 90 degrees. The phase unwrapping methods described herein can correctly unwrap the phase of the open-loop and closed-loop frequency responses for positive and negative phases up to well over 1000 degrees by analyzing the phase of the previous excitation signal frequency and the current phase.

To perform the phase unwrapping, the Bode magnitude and phase is calculated through Y=F(U) at one frequency f, with additional phase unwrapping using a previous frequency's phase (where U is a discrete input signal array in signal units, and Y is a discrete output signal array also in signal units). For example, once the Bode magnitude and phase are determined, the phase difference between the output phase $Y_{pha}$ and the input phase $U_{pha}$ is determined:

$$\text{phaseTemp} = Y_{pha} - U_{pha} \qquad (30)$$

Then, the phase is unwrapped by determining the difference between the current phase difference (phaseTemp) for the current frequency f and the previous phase difference (phasePrevious) of the previous frequency and determining a phase factor (phaseFactor) based on this result, according to the following routine:

$$\text{phaseDelta} = \text{phaseTemp} - \text{phasePrevious} \qquad (31)$$

$$\text{phaseFactor} = \text{round}(\text{abs}(\text{phaseDelta}/270)) - 1 \qquad (32)$$

if phaseFactor<1, then phaseFactor=1 \qquad (33)

if phaseFactor<=(-270*phaseFactor), then
    phaseTemp=phaseTemp+360*phaseFactor \qquad (34)

if phaseDelta>=(270*phaseFactor), then
    phaseTemp=phaseTemp-360*phaseFactor \qquad (35)

$$\text{phase} = \text{phaseTemp} \qquad (36)$$

The phase is unwrapped by setting the current frequency's phase to the value of phaseTemp (equation (36)), which itself depends on the calculated phase factor, and which is a function of the difference between the current frequency's phase and the previous frequency's phase. This method can be implemented in the drive (e.g., as part of performance metric component 210) to facilitate accurate phase measurement during the frequency response analysis. This phase unwrapping method can be enhanced with an 8-quadrant phase unwrapping that allows correct unwrapping of the phase for resonant and anti-resonant frequencies by analyzing magnitude and phase concurrently.

Figure 19:
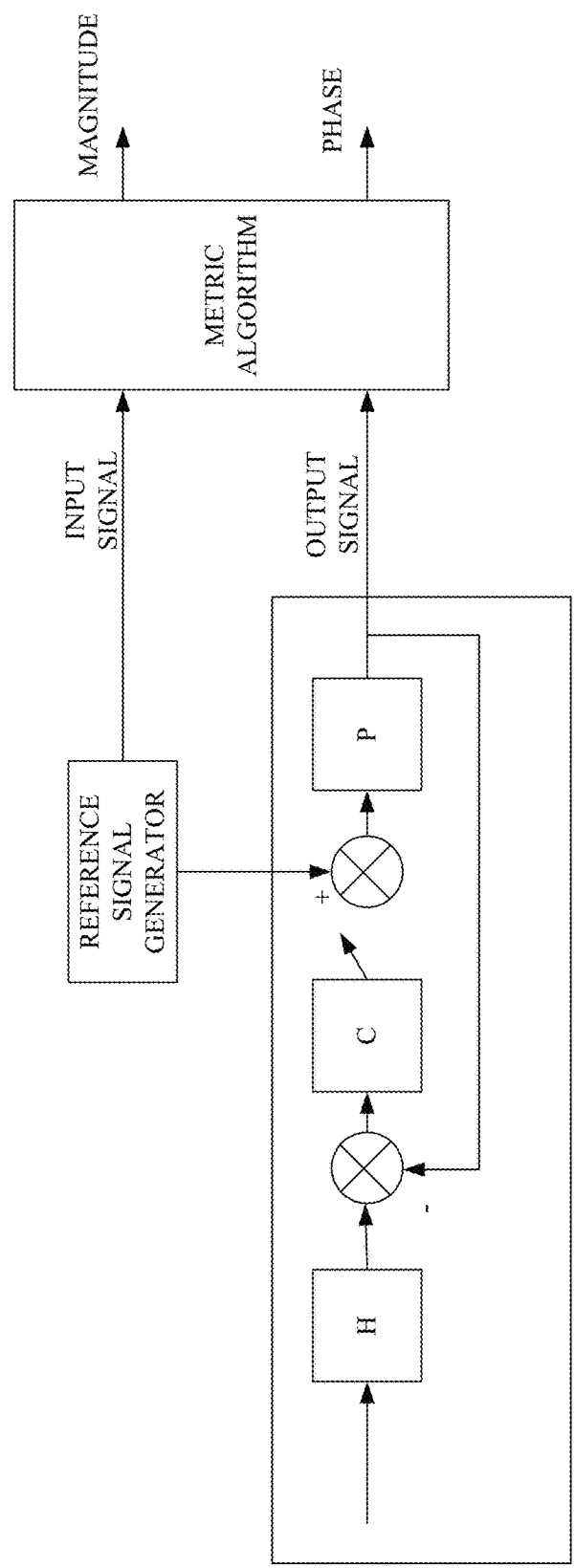
FIG. 19 is a block diagram of a generalized configuration for generating a plant identification Bode plot.
Figure 20:
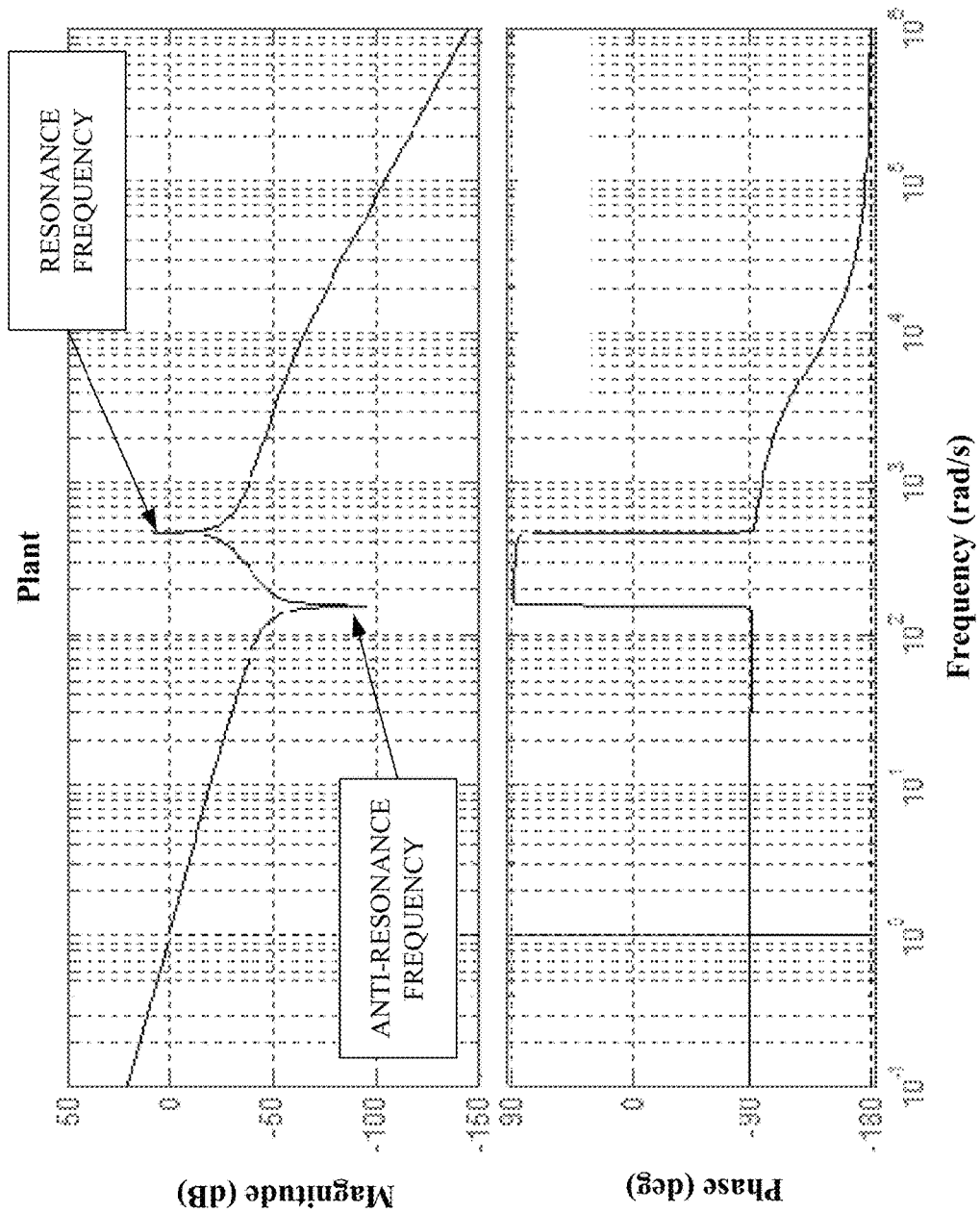
FIG. 20 is an example plant identification Bode plot.

According to yet another aspect of the drive-based frequency response analysis tools described herein, some embodiments of the performance metric component 210 can be configured to estimate the four metrics described above—open-loop frequency response, closed-loop frequency response, tracking error frequency response, and disturbance rejection frequency response—using the measured plant identification response. As noted above, the plant identification response characterizes the plant transfer function P, and is independent of tuning gains. FIG. 19 illustrates a block diagram of a generalized configuration for generating a plant identification Bode plot. As illustrated in this figure, the plant P is isolated from the control system so that the dynamics of the mechanical system (e.g., the power converter, motor, mechanical load, non-ideal feedback device, etc.) can be identified and characterized by the resulting plant identification response. The output signal from the plant P represents position feedback, and the input signal to the plant represents a torque command with no disturbances present. The measured signals are then used to compute the plant identification Bode plot. FIG. 20 illustrates an example plant identification Bode plot.

According to one or more embodiments described herein, the performance metric component 210 can estimate the open-loop frequency response, closed-loop frequency response, tracking error frequency response, and disturbance rejection frequency response from the plant identification response by creating a mathematical model of the controller and convoluting the model with the plant identification response to estimate the metrics. Using this technique, the time to measure all four metrics is reduced, since only a single frequency response test is required.

The measured plant identification response convoluted with the control system can also be used in a simulation environment to derive system performance metrics such as position following error and toque profile required for a given motion profile. Moreover, deriving the four metrics from a single frequency response test (e.g., the plant identification) allows the results to be scaled for different gain sets without re-running the frequency response tests.

It is to be appreciated that derivation of the four metrics described above is not limited to estimation based on the plant identification response, and that some embodiments of the performance metric component 210 may derive each of the four metrics using individual frequency response testing using one or more of the frequency response tools and techniques described herein.

In some embodiments, the frequency response tools described herein can also be used to derive internal system signals—such as position following error, actual position, and torque—from the frequency response. To this end, the frequency response of the motion profile is combined with the system frequency response, and the inverse DFT is used to derive parameters and metrics. This method can be used to generate metrics on customer machines, identify best case performance for a motor and drive combination, and generate metrics for laboratory setups which allow users to scale results for drive frame size, motor and load, use in specification of drives.

According to another frequency response derivation technique, some embodiments of the performance metric component 210 can derive the open-loop frequency response from a closed-loop test. As described above in connection with FIGS. 5 and 6, the open-loop frequency response is typically derived with the feedback signaling to the controller disconnected (as illustrated in FIG. 6). However, this open-loop control configuration is less safe than closed-loop control when performed on a machine. This is because the load is always more accurately controlled during closed-loop testing and measurement relative to open-loop control, which performs no error correction based on measured feedback. Therefore, one or more embodiments of the performance metric component 210 can be configured to calculate the open-loop frequency response from a closed-loop frequency response using the following relationship:

$$L = \frac{T}{H - T} \qquad (37)$$

where L is the loop gain characterized by the open-loop frequency response, T is the closed-loop transfer function, and H is the pre-filter (see, e.g., FIGS. 6 and 8). If closed-loop transfer function T is generated with velocity feed forward and acceleration feed forward set to zero to make H=1, the open-loop Bode calculation is simplified (otherwise, H can be difficult to calculate, depending on the controller configuration). Making H=1 yields the following:

$$L = \frac{T_{H1}}{1 - T_{H1}} \qquad (38)$$

where $T_{H1}$=T when H=1.

By implementing this relationship in the drive's firmware and performing the closed-loop frequency response test with velocity feed forward and acceleration feed forward set to zero, the performance metric component 210 can perform all frequency response tests—including derivation of the open-loop frequency response—with the load maintained under closed-loop control, allowing the performance metrics to be derived more safely under controlled conditions.

Once the drive 202 has obtained the frequency responses for open-loop, closed-loop, tracking error, and disturbance rejection for an existing system, these metrics can be used to analyze performance. The frequency response of an existing machine can be imported into application simulation software to define tuning gains (including notch filter and low-pass filter), verify stability and robustness, and derive internal parameter such as position following error, actual position, and torque requirements. The frequency response of an existing system is a richer dataset than conventional torque and speed curves that are sometimes used for sizing. In this regard, torque and speed curves do not allow a user to correctly tune the system, check for stability, and estimate position error, which is possible using the frequency response of the system.

If the machine is still in the design stage, the information obtained from this simulation software can be used to obtain the frequency response of the system. The algorithms and frequency response analysis tools for generating the four performance metrics and plant identification can be implemented in the simulation software to derive the performance metrics from existing mechanism templates (templates of the controlled mechanical system) and also future new mechanisms. By combining the frequency response of the system with the frequency response of the motion profile, position following error, actual position, and torque requirement can be derived. The tuning gains, stability verification, and robustness to load disturbance can also be estimated from this simulation. The performance metrics obtained from the simulation software can be compared to the same metrics measured from the machine once the machine is build to validate the correct modeling of the system.

The techniques described herein allow a user to determine four performance metrics for a drive—open-loop frequency response, closed-loop frequency response, tracking error frequency response, and disturbance rejection frequency response—using frequency response analysis tools. These performance metrics can then be used to fairly compare drive performance across various drive models and families. Since the performance metrics are independent of tuning, the metrics allow a best case fair comparison to be performed across multiple drives. The metrics are a function of input frequency, and are independent of motion profile. The frequency response data derived using the techniques described herein also provide best case information for rigid loads, thereby generalizing performance for a wide range of load types.

For drive manufacturers, the integrated frequency response analysis tools can be used to perform in-house frequency response testing on a range of test loads, and the resulting frequency response data can be used to specify, design, validate, and document drive performance as new drives are developed. Since the resulting frequency response data is independent of motion profile, the corresponding performance metric data generalizes drive performance for a wide range of loads, and can therefore be published with the drive specifications to assist end users in selecting a suitable drive for their particular industrial applications.

Additionally, end users can use the drive's integrated analysis tools to perform frequency response analysis for their particular industrial applications after the drive is installed, yielding application-specific frequency response results and performance metrics for the user's unique control system. These performance metrics can be used, for example, to identify whether the drive or the mechanical system is a limiting factor to machine performance, assisting the user in identifying where to invest resources to improve system performance.

The signal generator component 208 used to generate the command signal for each performance metric is designed to modulate the amplitude of the signal according to limits of the drive, user limits, and test frequency. This mitigates the problem of saturation during the tests, which can invalidate the results. This also allows the signal generator component 208 to generate larger signals without saturating the system, mitigating noise issues. This is in contrast to conventional signal generation methods, which apply a constant low amplitude signal to the drive for all frequencies in the frequency response plot to avoid saturation at higher frequencies, which can cause noise to interfere with the results.

The Exact DFT/FET described herein (implemented as part of the performance metric component 210) decouples the frequency bins from the number of samples to compute the frequency response of a signal. This eliminates computational issues (e.g., spectral leakage and excessive computation time) that render it difficult to implement a conventional DFT in industrial drives. Using conventional DFT, the number of frequency bins and their linear spacing are functions of the number of the time samples. As a result, measurement errors (spectral leakage) occur. These issues are mitigated using the Exact DFT/FFT of the present disclosure.

The techniques described herein for deriving drive performance metrics have a number of advantages over standard approaches that obtain performance data of a motor, drive, and load for only a single operating condition (including a single motion profile, set of tuning gains, drive frame size, motor, and load). Such standard approaches do not easily translate to customer scenarios and across product platforms. By contrast, the performance metrics derived using the techniques and tools herein are independent of motion profile since the metrics are a function of input frequency. Moreover, the metrics derived herein are independent of tuning, thereby allowing a fair system comparison across different drives independent of the particular tunings of the drives. The performance metrics derived using these methods are generalized for a wide range of industrial systems, and can be scaled to translate to customer scenarios and across product platforms.

As an internal tool for drive manufacturers, the performance metrics derived using the methods described herein can be used to address the internal need to include drive performance in the initial product specification. Since the performance metrics are independent of tuning and motion profile, the metrics can be used to specify, design, validate, and document drive performance. These performance metrics are particularly important when a new generation of drives is developed to replace older legacy drives, since the end users need to be assured that the performance of the new drive will meet or exceed the performance of the older drives.

As both an internal and external tool (for drive manufacturers and end users alike), the methods described herein can address the internal and external needs to use drive performance as a differentiator during the motor/drive selection and sales process, since customers are technically focused and can use the performance metrics to select an appropriate drive for their industrial application. The frequency response results derived using the integrated analysis tools on the drive can be used to identify the drive or the mechanical system as the limiting factor in machine performance, and can also be used to monitor machine degradation over time by observing changes to the frequency response curves over time.

When provided to a simulation software tool the performance metrics can be used to validate motor/drive sizing, and to analyze and tune existing systems. The systems described herein can also be used as a tool to define performance metrics of systems still in the design stage to ensure that machine specifications are met.

The frequency response curves for open-loop, closed-loop, tracking error, and disturbance rejection represent a signature of the controlled machine. As such, the frequency response data can be imported into a simulation software tool and used in place of a physical model of a system to be controlled. Accordingly, in some embodiments, a user interface (e.g., interface 302 of FIG. 3) can be connected to the drive 202 and used to extract the frequency response and performance metric data generated by the performance metric component 210. The data can then be imported into a simulation software tool to facilitate accurate simulation of the system. Such simulations can be used to predict machine performance and compliance, system bandwidth, and to tune the system, as well as to predict position following error and torque requirements for a given motion profile. In another example simulation, the frequency response curves for a given system can be used to test different operating scenarios for the system (e.g., faster operating speeds to reduce cycle times or increase output) in order to predict unexpected resonances or other possible concerns that may arise during operation at these different scenarios.

FIGS. 21-25 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Figure 21:
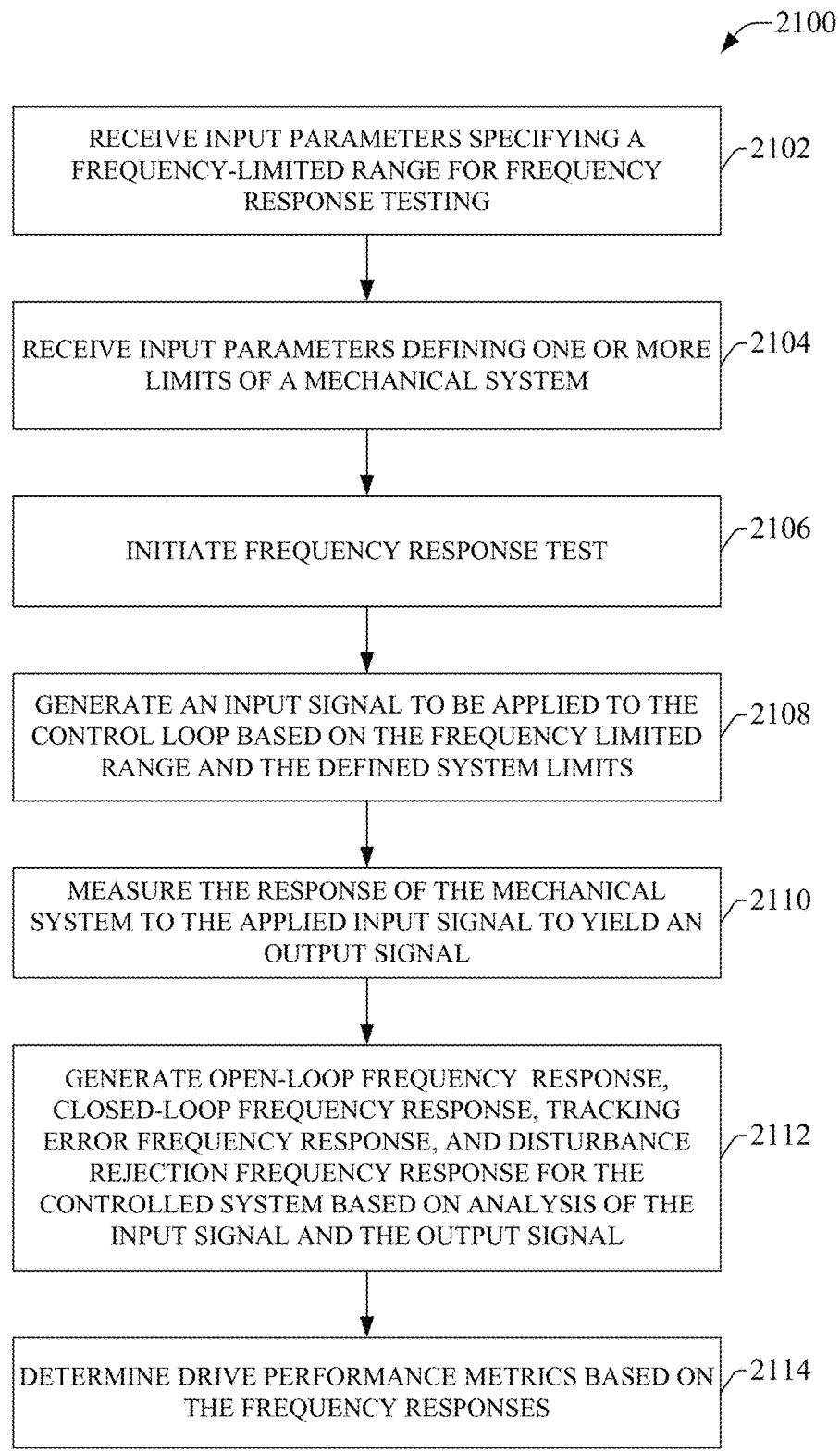
FIG. 21 is a flowchart of an example methodology for generating performance metrics for a motor drive using a frequency-limited frequency response testing.

FIG. 21 illustrates an example methodology 2100 for generating performance metrics for a motor drive using a frequency-limited frequency response testing. Initially, at 2102, input parameters specifying a frequency-limited range for frequency response testing are received. In an example scenario, these parameters can be provided to a motor drive via a user interface connected to the drive (e.g., user interface 302), and can specify a start frequency and a stop frequency for the frequency response testing. At 2104, additional input parameters defining one or more limits of a mechanical system to be driven by the motor drive can be received. These system limits can include, but are not limited to, a travel limit, velocity limit, torque limit, bias direction, and/or bias amplitude for the system. At 2106, the frequency response test is initiated. In some embodiments, the test can be initiated by pressing a button on the drive, or by sending a start instruction to the drive via the user interface connected to the drive. At 2108, an input signal is generated by the drive and applied to the control loop, where the magnitude, phase, and frequency of the input signal is generated according to an algorithm stored on the drive based on the frequency limited range and the defined system limits defined at steps 2102 and 2104.

At 2110, an output signal representing the response of the mechanical system to the applied input signal is measured. At 2112, a set of four frequency response are generated using by the drive based on analysis of the input signal and the output signal, including the open-loop frequency response, the closed-loop frequency response, the tracking error frequency response, and the disturbance rejection frequency response. At 2114, performance metrics for the drive are determined based on the frequency responses generated at step 2112. Example performance metrics can include, but are not limited to, zero-crossing bandwidth, gain margin, phase margin, system bandwidth, position and velocity error as a function of frequency, and position and velocity error as a function of load disturbance on the mechanical system.

Figure 22:
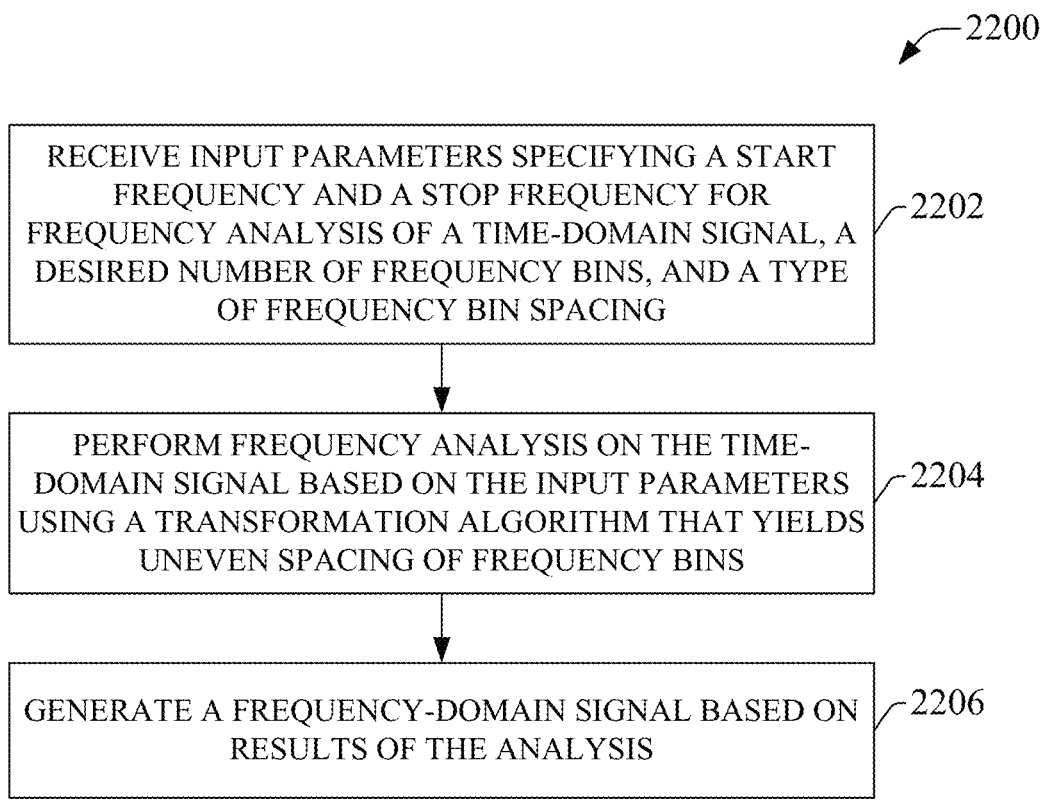
FIG. 22 is a flowchart of an example methodology for performing frequency-response analysis on a time-domain signal in a manner that reduces or eliminates spectral leakage.

FIG. 22 illustrates an example methodology 2200 for performing frequency-response analysis on a time-domain signal in a manner that reduces or eliminates spectral leakage. Initially, at 2202, input parameters are received specifying a start frequency and a stop frequency for frequency analysis of a time-domain signal, a desired number of frequency bins for the analysis, and a type of frequency bin spacing for the analysis. The start and stop frequencies define the frequency range for the frequency analysis. The number of frequency bins specifies the number of frequency bins that will be generated within the specified frequency range (between the start and stop frequencies) by the analysis. The type of spacing defines whether the frequency bins will be spaced according to a linear spacing, a logarithmic spacing, or other suitable type of spacing. These parameters can be provided to a motor drive via a user interface (e.g., user interface 302).

At 2204, frequency analysis is performed on the time-domain signal based on the input parameters received at step 2202 using an algorithm that executes on the motor drive. The algorithm may comprise an Exact DFT algorithm that yields even or uneven spacing of frequency bins between the start and stop frequency based on the indicated desired number of frequency bins and the type of frequency bin spacing specified at step 2202. At 2206, a frequency-domain signal is generated based on results of the analysis. By allowing the user to define the frequency range for the test narrowly around the desired frequency range for the Exact DFT analysis, and by allowing uneven spacing of frequency bins, a desired frequency component of the time-domain signal can be made to align with one of the resulting frequency bins, resulting in a frequency-domain signal that accurately conveys the frequency component of the time-domain signal without spectral leakage.

Figure 23:
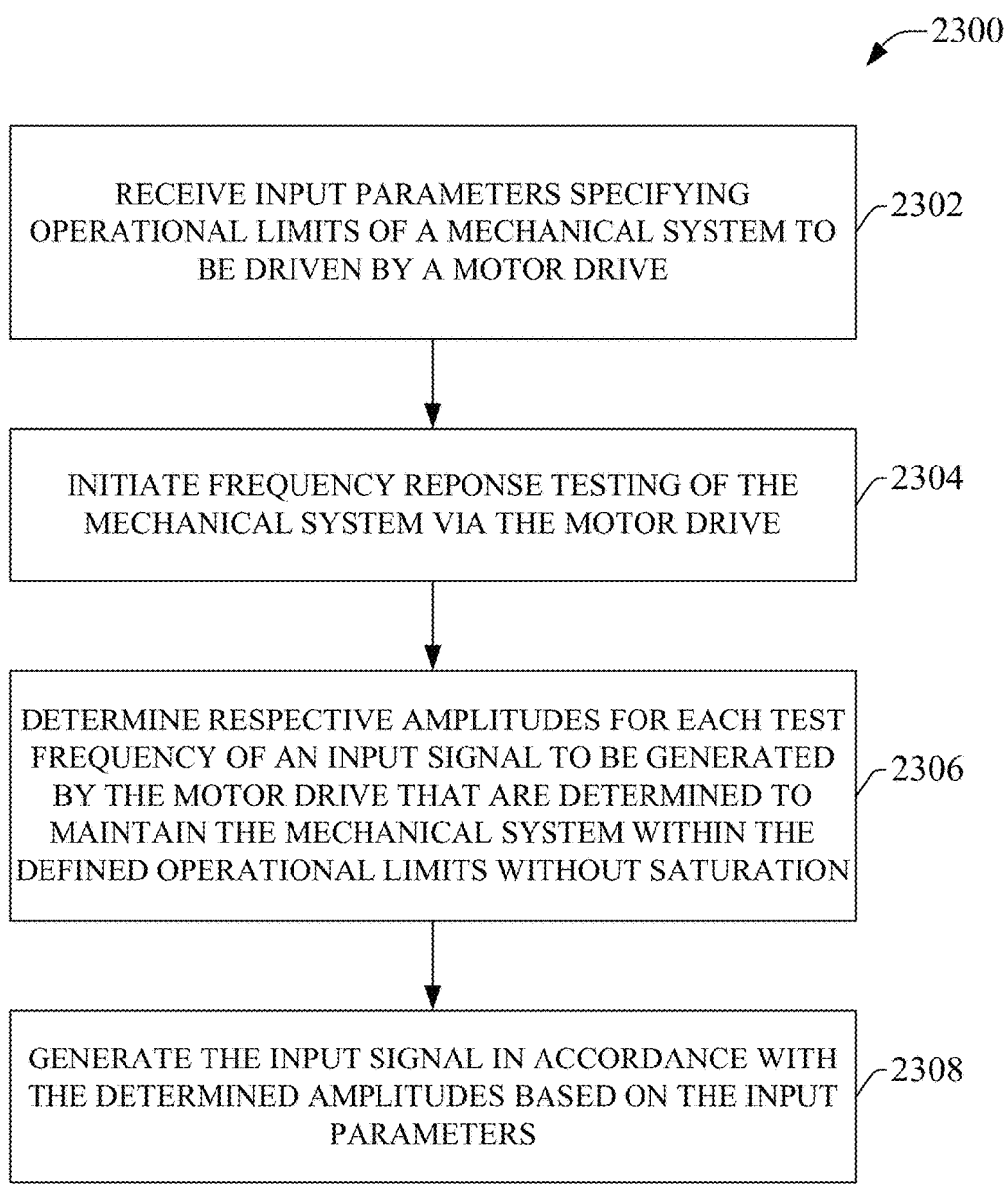
FIG. 23 is a flowchart of an example methodology for generating an input signal for frequency response testing such that the amplitude of the input signal is scaled as a function of frequency to avoid system saturation.

FIG. 23 illustrates an example methodology 2300 for generating an input signal for frequency response testing such that the amplitude of the input signal is scaled as a function of frequency to mitigate system saturation. Initially, at 2302, input parameters are received that specify operational limits of a mechanical system to be driven by a motor drive. These parameters can include, but are not limited to, a travel limit, a velocity limit, a torque limit, a bias direction, or a bias amplitude. These parameters can be provided to the motor drive via a user interface connected to the drive (e.g., user interface 302).

At 2304, frequency response testing of the mechanical system is initiated via the motor drive. In some embodiments, the test can be initiated by pressing a button on the motor drive, or by initiating the test via the user interface. At 2306, a signal generator component of the motor drive determines respective amplitudes for each test frequency of an input signal to be generated based on the input parameters received at step 2302, as well as internal parameters of the drive itself, which may be a function of the drive type, model, and specifications. Example internal drive parameters can include, but are not limited to, a rotary rated speed, a feedback resolution, a system inertia, and/or a maximum speed. Based on the received and internal parameters, the signal generator component determines a maximum amplitude for each frequency of the input signal that can be applied to the system without causing the drive and motor of the mechanical system to exceed the defined position, velocity, and acceleration limits as the input signal frequency increases.

At 2308, the input signal is generated in accordance with the amplitudes determined at step 2306. In this regard, the signal generator component scales the input signal as the frequency increases to avoid saturation of the system and reduce or eliminate noise.

Figure 24:
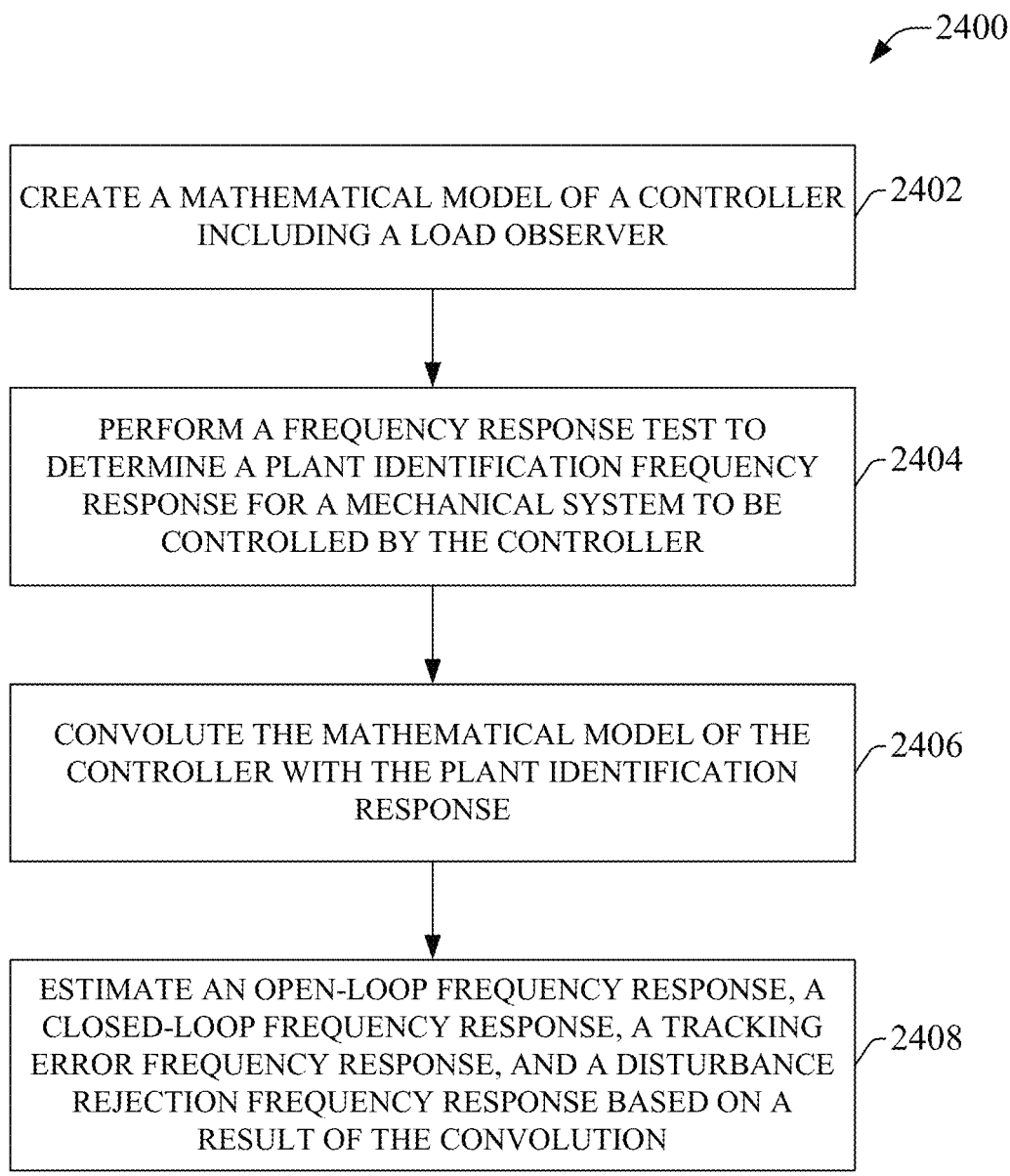
FIG. 24 is a flowchart of an example methodology for deriving four drive performance metric frequency responses from a single frequency response test.

FIG. 24 illustrates an example methodology 2400 for deriving four drive performance metric frequency responses from a single frequency response test. Initially, at 2402, a mathematical model of a controller is created. The model represents a controller for controlling a system comprising a motor drive, motor, and mechanical load. At 2404, a frequency response test is performed to determine a plant identification response for the drive/motor/load system.

At 2406, the mechanical model of the controller created at step 2402 is convoluted with the plant identification response determined at step 2404. At 2408, estimates of the open-loop frequency response, closed-loop frequency response, tracking error frequency response, and disturbance rejection frequency response for the drive/motor/load system based on a result of the convolution performed at step 2046. Using this technique, the four performance metric responses can be derived by performing only a single frequency response test.

Figure 25A:
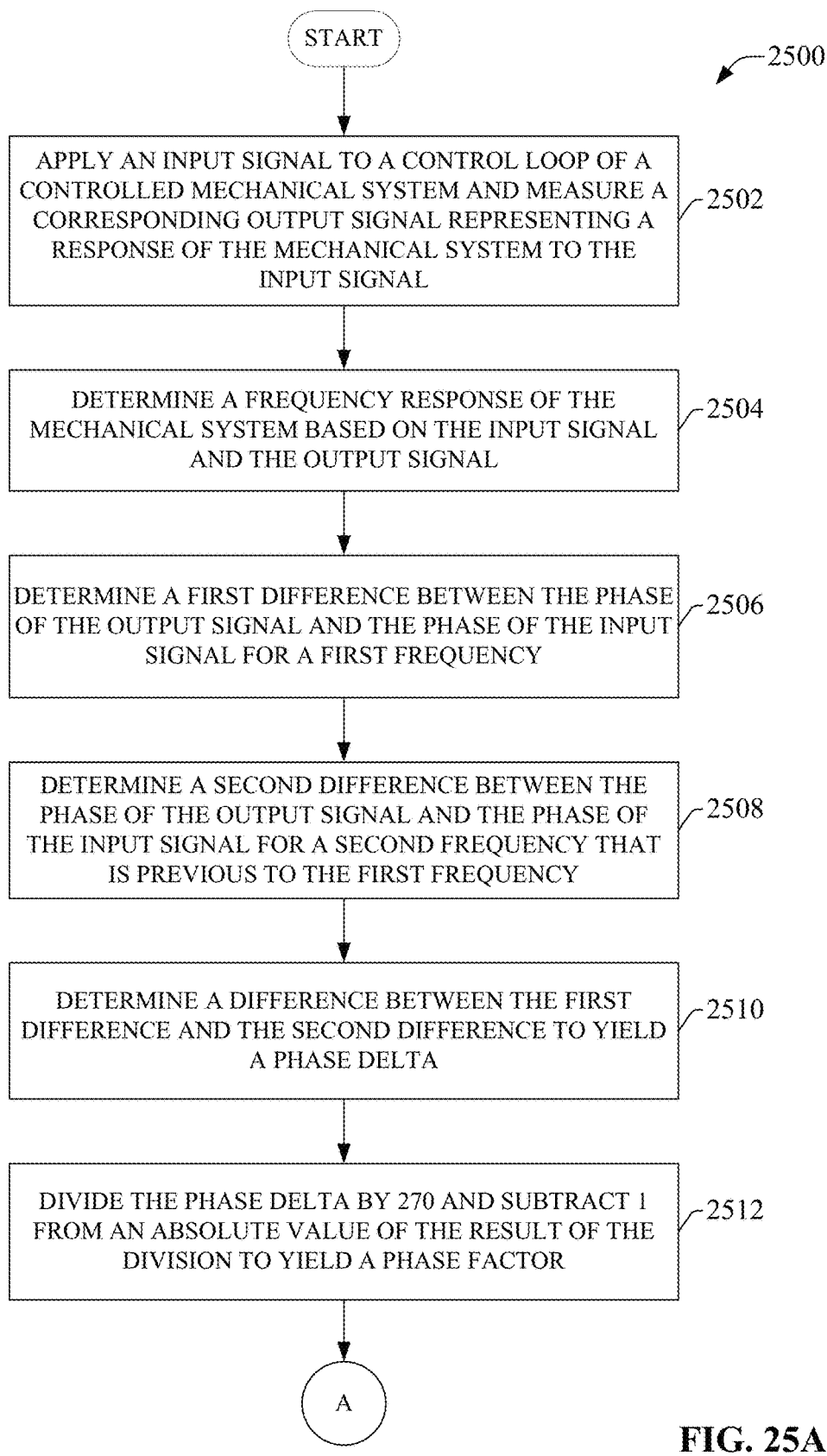
FIGS. 25A and 25B illustrate a flowchart of an example methodology for unwrapping the phase of a frequency response curve at a given excitation signal frequency through analysis of the phase of a previous excitation signal frequency relative to the phase of a given frequency.
Figure 25B:
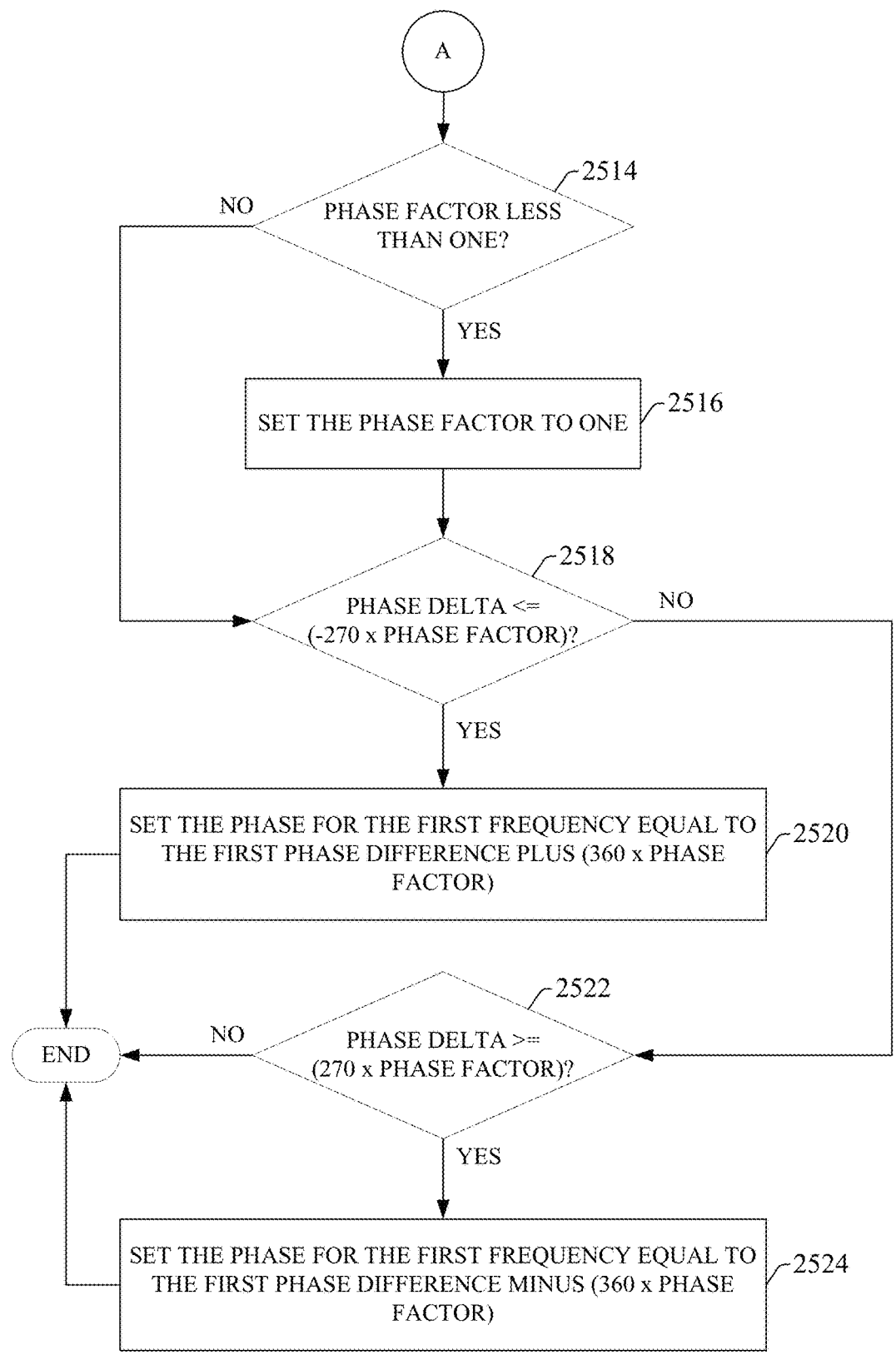

FIGS. 25A and 25B illustrate an example methodology 2500 for unwrapping the phase of a frequency response curve at a given excitation signal frequency through analysis of the phase of a previous excitation signal frequency. Initially, at 2502 of FIG. 25A, an input signal is applied to a control loop of a controlled mechanical system, and a corresponding output signal representing a response of the mechanical system to the input signal is measured. At 2504, a frequency response of the mechanical system is determined based on the input signal and the output signal.

At 2506, a first difference between the phase of the output signal and the phase of the input signal is determined for a first frequency. At 2508, a second difference between the phase of the output signal and the phase of the input signal is determined for a second frequency that is previous to the first frequency.

At 2510, a difference between the first difference determined at step 2506 and the second difference determined at step 2508 is calculated to yield a phase delta. At 2512, the phase delta is divided by 270, and one is subtracted from the result of the division to yield a phase factor.

The methodology continues on FIG. 25B. At 2514, a determination is made regarding whether the phase factor is less than one. If the phase factor is less than one, the phase factor is set to one at step 2516, and the methodology moves to step 2518. If the phase factor is not less than one, the methodology moves to step 2518 without modifying the phase factor.

At 2518, a determination is made regarding whether the phase delta determined at step 2510 is less than or equal to the phase factor multiplied by −270. If so, the phase for the first frequency is set to be equal to the first phase difference determined at step 2506 plus 360 times the phase factor, and the methodology ends.

If the phase delta is not less than or equal to the phase factor multiplied by −270, the methodology moves to step 2522, where a determination is made regarding whether the phase delta is greater than or equal to the phase factor multiplied by 270. If so, the phase for the first frequency is set to be equal to the first phase difference determined at step 2506 minus 360 times the phase factor, and the methodology ends. If the phase delta is not greater than or equal to the phase factor multiplied by 270, the methodology ends without modifying the phase for the first frequency.

In some embodiments, methodology 2500 can be implemented in a motor drive as part of performance metric component 210 to facilitate accurate phase unwrapping of frequency response data generated using the frequency response analysis tools described herein. Alternatively, methodology 2500 may be implemented in a user interface (e.g., user interface 302) to facilitate rendering accurate frequency response curves with suitable phase unwrapping.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 26:
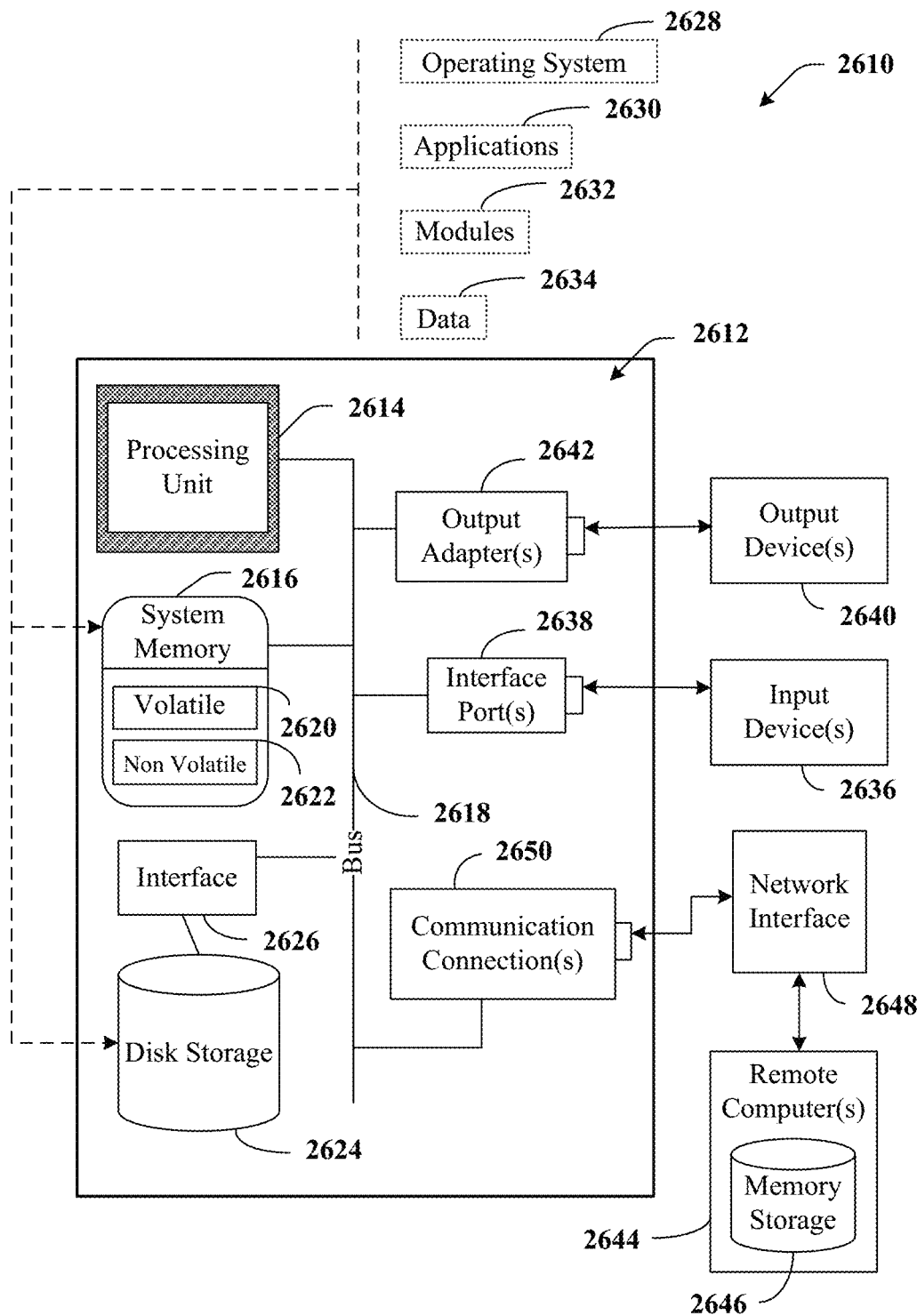
FIG. 26 is an example computing environment.
Figure 27:
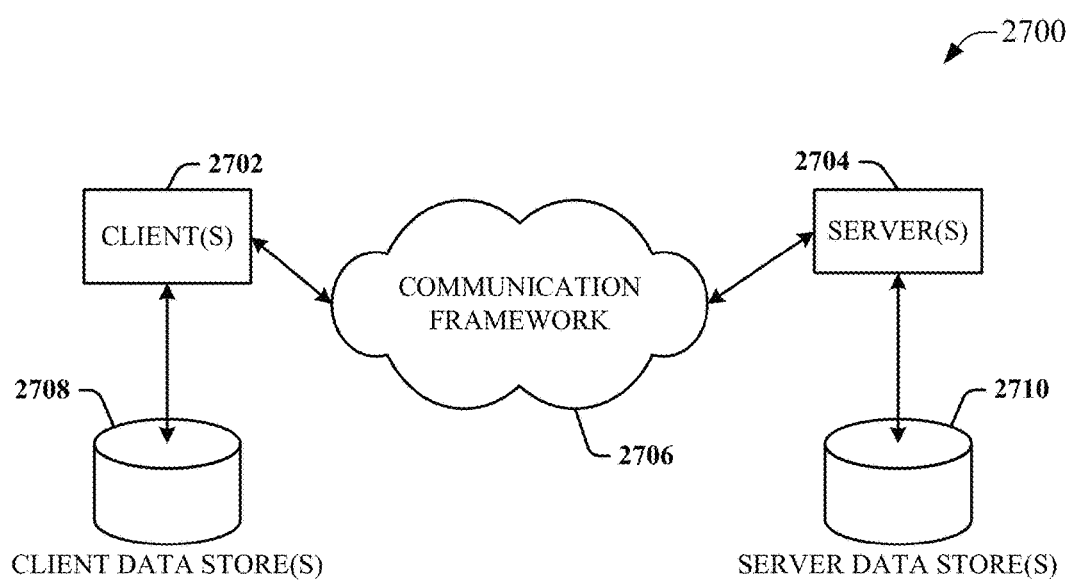
FIG. 27 is an example networking environment.

In order to provide a context for the various aspects of the disclosed subject matter, FIGS. 26 and 27 as well as the following discussion are intended to provide a brief, general description of a suitable environment in which the various aspects of the disclosed subject matter may be implemented.

With reference to FIG. 26, an example environment 2610 for implementing various aspects of the aforementioned subject matter includes a computer 2612. The computer 2612 includes a processing unit 2614, a system memory 2616, and a system bus 2618. The system bus 2618 couples system components including, but not limited to, the system memory 2616 to the processing unit 2614. The processing unit 2614 can be any of various available processors. Multi-core microprocessors and other multiprocessor architectures also can be employed as the processing unit 2614.

The system bus 2618 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 2616 includes volatile memory 2620 and nonvolatile memory 2622. The basic input/output system (BIOS), containing the basic routines to transfer information between elements within the computer 2612, such as during start-up, is stored in nonvolatile memory 2622. By way of illustration, and not limitation, nonvolatile memory 2622 can include read only memory (ROM), programmable ROM (PROM), electrically programmable ROM (EPROM), electrically erasable PROM (EEPROM), or flash memory. Volatile memory 2620 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 2612 also includes removable/non-removable, volatile/nonvolatile computer storage media. FIG. 26 illustrates, for example a disk storage 2624. Disk storage 2624 includes, but is not limited to, devices like a magnetic disk drive, floppy disk drive, tape drive, Jaz drive, Zip drive, LS-100 drive, flash memory card, or memory stick. In addition, disk storage 2624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2624 to the system bus 2618, a removable or non-removable interface is typically used such as interface 2626.

It is to be appreciated that FIG. 26 describes software that acts as an intermediary between users and the basic computer resources described in suitable operating environment 2610. Such software includes an operating system 2628. Operating system 2628, which can be stored on disk storage 2624, acts to control and allocate resources of the computer 2612. System applications 2630 take advantage of the management of resources by operating system 2628 through program modules 2632 and program data 2634 stored either in system memory 2616 or on disk storage 2624. It is to be appreciated that one or more embodiments of the subject disclosure can be implemented with various operating systems or combinations of operating systems.

A user enters commands or information into the computer 2612 through input device(s) 2636. Input devices 2636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2614 through the system bus 2618 via interface port(s) 2638. Interface port(s) 2638 include, for example, a serial port, a parallel port, a game port, and a universal serial bus (USB). Output device(s) 2640 use some of the same type of ports as input device(s) 2636. Thus, for example, a USB port may be used to provide input to computer 2612, and to output information from computer 2612 to an output device 2640. Output adapters 2642 are provided to illustrate that there are some output devices 2640 like monitors, speakers, and printers, among other output devices 2640, which require special adapters. The output adapters 2642 include, by way of illustration and not limitation, video and sound cards that provide a means of connection between the output device 2640 and the system bus 2618. It should be noted that other devices and/or systems of devices provide both input and output capabilities such as remote computer(s) 2644.

Computer 2612 can operate in a networked environment using logical connections to one or more remote computers, such as remote computer(s) 2644. The remote computer(s) 2644 can be a personal computer, a server, a router, a network PC, a workstation, a microprocessor based appliance, a peer device or other common network node and the like, and typically includes many or all of the elements described relative to computer 2612. For purposes of brevity, only a memory storage device 2646 is illustrated with remote computer(s) 2644. Remote computer(s) 2644 is logically connected to computer 2612 through a network interface 2648 and then physically connected via communication connection 2650. Network interface 2648 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2650 refers to the hardware/software employed to connect the network interface 2648 to the system bus 2618. While communication connection 2650 is shown for illustrative clarity inside computer 2612, it can also be external to computer 2612. The hardware/software necessary for connection to the network interface 2648 includes, for exemplary purposes only, internal and external technologies such as, modems including regular telephone grade modems, cable modems and DSL modems, ISDN adapters, and Ethernet cards.

FIG. 27 is a schematic block diagram of a sample computing environment 2700 with which the disclosed subject matter can interact. The sample computing environment 2700 includes one or more client(s) 2702. The client(s) 2702 can be hardware and/or software (e.g., threads, processes, computing devices). The sample computing environment 2700 also includes one or more server(s) 2704. The server(s) 2704 can also be hardware and/or software (e.g., threads, processes, computing devices). The servers 2704 can house threads to perform transformations by employing one or more embodiments as described herein, for example. One possible communication between a client 2702 and servers 2704 can be in the form of a data packet adapted to be transmitted between two or more computer processes. The sample computing environment 2700 includes a communication framework 2706 that can be employed to facilitate communications between the client(s) 2702 and the server(s) 2704. The client(s) 2702 are operably connected to one or more client data store(s) 2708 that can be employed to store information local to the client(s) 2702. Similarly, the server(s) 2704 are operably connected to one or more server data store(s) 2710 that can be employed to store information local to the servers 2704.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A motor drive, comprising:
a memory that stores computer-executable components;
a processor, operatively coupled to the memory, that executes the computer-executable components, the computer-executable components comprising:
an interface component configured to receive one or more configuration parameters, wherein the input parameters comprise at least a start frequency for a frequency analysis, a stop frequency for the frequency analysis, a number of frequency bins to be generated by the frequency analysis, and a type of spacing to be used to space the frequency bins;
a signal generator component configured to generate an input signal that controls a mechanical system during a frequency response test sequence; and
a performance metrics component configured to generate performance metric data for the motor drive based on the input signal and an output signal measured from the mechanical system representing a response of the mechanical system to the input signal,
wherein the performance metrics component is further configured to transform at least one of the input signal or the output signal from a time-domain signal to a frequency-domain signal based on the one or more input parameters, the frequency-domain signal comprises the number of frequency bins defined by the one or more input parameters, and the frequency bins are spaced between the start frequency and the stop frequency according to the type of spacing define by the one or more input parameters.

2. The motor drive of claim 1, wherein the performance metric data comprises open-loop response data, closed-loop response data, tracking error response data, and disturbance rejection response data.

3. The motor drive of claim 2, wherein the performance metrics component is further configured to unwrap a phase of frequency response curve data for a first frequency based on concurrent analysis of a first phase of the frequency response curve data at the first frequency and a second phase of the frequency response curve data at a second frequency that is previous to the first frequency.

4. The motor drive of claim 2, wherein the frequency response test sequence is a closed-loop test, and the performance metric component is further configured to derive the open-loop response data from a result of the closed-loop test.

5. The motor drive of claim 2, wherein the performance metrics component is further configured to convolute a plant identification response generated by the frequency response test sequence with a mathematical model of a controller to facilitate derivation of the open-loop response data, the closed-loop response data, the tracking error response data, and the disturbance rejection response data.

6. The motor drive of claim 1, wherein the number of frequency bins is independent of a number of time samples of the time-domain signal.

7. The motor drive of claim 1, wherein the frequency bins are unevenly spaced between the start frequency and the stop frequency.

8. The motor drive of claim 1, wherein the frequency bins are evenly spaced between the start frequency and the stop frequency.

9. The motor drive of claim 1, wherein the one or more input parameters further comprise at least defined operational limits of the mechanical system, wherein the defined operational limits comprise at least a travel limit, a velocity limit, a torque limit, a bias direction, and a bias amplitude.

10. The motor drive of claim 9, wherein the input signal is a sinusoidal signal, and the signal generator component is further configured to scale an amplitude of the input signal as a function of a frequency of the input signal based on the defined operational limits.

11. The motor drive of claim 10, wherein the signal generator component is configured to reduce the amplitude of the input signal as the frequency increases.

12. A method for deriving motor drive performance metrics, comprising:
receiving, by a motor drive comprising at least one processor, input parameters comprising at least a start frequency for a frequency analysis, a stop frequency for the frequency analysis, a number of frequency bins to be generated by the frequency analysis, and a type of spacing to be used to space the frequency bins;
generating, by the motor drive, an input signal that controls a mechanical system during execution of a frequency response test;
measuring an output signal from the mechanical system representing a response of the mechanical system to the input signal; and
deriving performance metric data for the motor drive based on the input signal and the output signal,
wherein the deriving comprises at least transforming at least one of the input signal or the output signal from a time-domain signal to a frequency-domain signal based on the input parameters, the frequency-domain signal comprises the number of frequency bins defined by the input parameters, and the frequency bins are spaced between the start frequency and the stop frequency according to the type of spacing define by the input parameters.

13. The method of claim 12, wherein the deriving the performance metric data comprises deriving at least open-loop response data, closed-loop response data, tracking error response data, and disturbance rejection response data.

14. The method of claim 12, wherein the transforming comprises generating the number of frequency bins independently of a number of time samples of the time-domain signal.

15. The method of claim 12, wherein the transforming comprises one of spacing the frequency bins unevenly between the start frequency and the stop frequency or spacing the frequency bins evenly between the start frequency and the stop frequency.

16. The method of claim 12, wherein the input signal is a sinusoidal signal, and the generating comprises scaling an amplitude of the sinusoidal signal as a function of a frequency of the sinusoidal signal based on at least one of a defined travel limit of the mechanical system, a defined velocity limit of the mechanical system, a defined torque limit of the mechanical system, a defined bias direction, or a defined bias amplitude.

17. The method of claim 16, wherein the scaling comprising reducing the amplitude of the sinusoidal signal as the frequency increases.

18. The method of claim 12, further comprising unwrapping a phase of frequency response curve data for a first frequency based on concurrent analysis of a first phase of the frequency response curve data at the first frequency and a second phase of the frequency response curve data at a second frequency that is previous to the first frequency.

19. A non-transitory computer-readable medium having stored thereon instructions that, in response to execution, cause a motor drive to perform operations, the operations comprising:
receiving frequency test parameters comprising at least a start frequency for a frequency analysis, a stop frequency for the frequency analysis, a number of frequency bins to be generated by the frequency analysis, and a type of spacing to be used to space the frequency bins;
generating an input signal configured to actuate a mechanical system during a frequency response test;
measuring a response of the mechanical system to the input signal to yield an output signal; and
generating performance metric data for the motor drive based on the input signal and the output signal,
wherein the generating comprises at least:
transforming at least one of the input signal or the output signal from a time-domain signal to a frequency-domain comprising the number of frequency bins defined by the frequency test parameters, and
spacing the frequency bins between the start frequency and the stop frequency according to the type of spacing defined by the frequency test parameters.

20. The non-transitory computer-readable medium of claim 19, wherein the generating comprises generating at least open-loop response data, closed-loop response data, tracking error response data, and disturbance rejection response data.

* * * * *